US008288922B2

(12) United States Patent
Cross et al.

(10) Patent No.: US 8,288,922 B2
(45) Date of Patent: Oct. 16, 2012

(54) FLEXOELECTRIC—PIEZOELECTRIC COMPOSITE BASED ON FLEXOELECTRIC CHARGE SEPARATION

(75) Inventors: L. Eric Cross, State College, PA (US); Wenyi Zhu, State College, PA (US); Nan Li, State College, PA (US); John Y. Fu, State College, PA (US); Baojin Chu, State College, PA (US)

(73) Assignee: The Penn State Research Foundation, University Park, PA (US)

( * ) Notice: Subject to any disclaimer, the term of this patent is extended or adjusted under 35 U.S.C. 154(b) by 88 days.

(21) Appl. No.: 12/875,474

(22) Filed: Sep. 3, 2010

(65) Prior Publication Data
US 2011/0006641 A1 Jan. 13, 2011

Related U.S. Application Data

(63) Continuation-in-part of application No. 11/770,318, filed on Jun. 28, 2007, now Pat. No. 7,791,248.

(60) Provisional application No. 60/818,164, filed on Jun. 30, 2006.

(51) Int. Cl.
*H01L 41/08* (2006.01)

(52) U.S. Cl. .......................... 310/338; 310/311; 310/367

(58) Field of Classification Search .................. 310/311, 310/367, 338
See application file for complete search history.

(56) References Cited

U.S. PATENT DOCUMENTS

| | | | |
|---|---|---|---|
| 4,384,394 A | | 5/1983 | Lemonon et al. |
| 4,494,841 A | * | 1/1985 | Marcus .......................... 396/207 |
| 4,572,981 A | | 2/1986 | Zola |
| 4,761,711 A | | 8/1988 | Hiremath et al. |
| 5,657,054 A | * | 8/1997 | Files et al. ..................... 345/177 |
| 6,090,661 A | * | 7/2000 | Perng et al. .................... 438/248 |
| 6,194,228 B1 | | 2/2001 | Fujiki et al. |
| 6,369,489 B1 | * | 4/2002 | Sawai et al. ..................... 310/326 |
| 6,376,968 B1 | | 4/2002 | Taylor et al. |
| 6,657,364 B1 | | 12/2003 | Takeuchi et al. |
| 7,161,148 B1 | | 1/2007 | Givargizov et al. |
| 2003/0222944 A1 | * | 12/2003 | Matsuzawa ..................... 347/68 |
| 2003/0223155 A1 | * | 12/2003 | Uchiyama ................... 360/294.4 |
| 2003/0228418 A1 | | 12/2003 | Hines et al. |
| 2004/0156108 A1 | | 8/2004 | Chou et al. |
| 2005/0280335 A1 | | 12/2005 | Tomozawa et al. |

FOREIGN PATENT DOCUMENTS

JP 07115231 5/1995

OTHER PUBLICATIONS

J. Fousek, L.E. Cross, D.B. Litvin; "Possible piezoelectric composites based on the flexoelectric effect," Materials Letters, 39, 1999, pp. 287-291.
L.E. Cross; "Flexoelectric effects: Charge separation in insulating solids subjected to elastic strain gradients," Journal of Materials Science, 41, 2006, pp. 53-63.
W. Ma, L.E. Cross; "Strain-gradient-induced electric polarization in lead zirconate titanate ceramics," Applied Physics Letters, vol. 82, No. 19, May 12, 2003, pp. 3293-3295.
J.Y. Fu, W. Zhu, N. Li, L.E. Cross; "Experimental studies of the converse flexoelectric effect induced by inhomogeneous electric field in a barium strontium titanate composition," Journal of Applied Physics, 100, 2006.
W. Zhu, J.Y. Fu, N. Li, L. Cross; "Piezoelectric composite based on the enhanced flexoelectric effects," Applied Physics Letters, 89, 2006.
W. Ma, L.E. Cross; "Flexoelectricity of barium titanate," Applied Physics Letters, 88, 2006.

* cited by examiner

*Primary Examiner* — Thomas Dougherty
*Assistant Examiner* — Bryan Gordon
(74) *Attorney, Agent, or Firm* — Gifford, Krass, Sprinkle, Anderson & Citkowski, P.C.; Douglas L. Wathen

(57) ABSTRACT

An example flexoelectric-piezoelectric apparatus provides an electrical response to an applied force, and/or an actuation in response to an applied electric field, that originates from the flexoelectric properties of a component. For example, shaped forms within the apparatus may be configured to yield a stress gradient on application of the force, and the stress gradient induces the flexoelectric signal. A flexoelectric-piezoelectric apparatus can be substituted for a conventional piezoelectric apparatus, but does not require the use of a piezoelectric material. Instead, the response of the apparatus is due to the generation of stress gradients and/or field gradients.

8 Claims, 12 Drawing Sheets

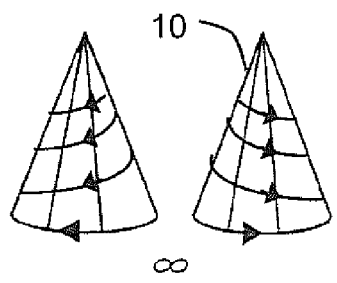
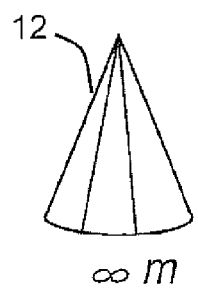
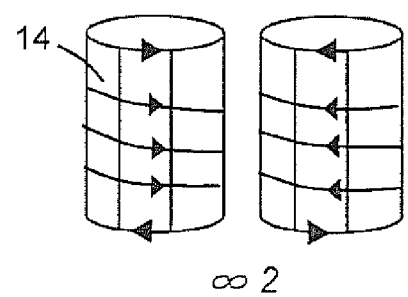
∞              ∞ m              ∞ 2
FIG – 1A         FIG – 1B         FIG – 1C
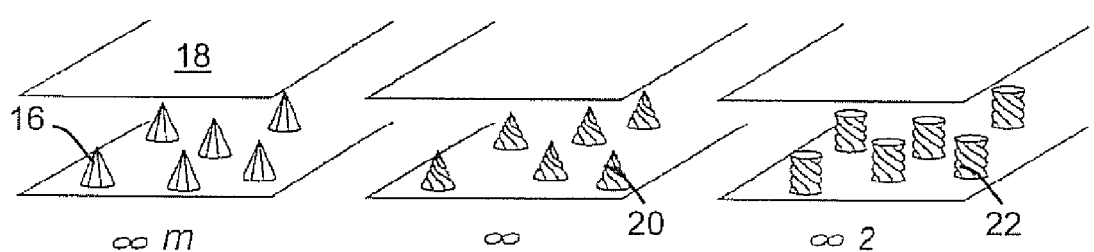
∞ m              ∞              ∞ 2
          (Symmetry of FIG 1A)   (Symmetry of FIG 1C)
FIG – 1D         FIG – 1E         FIG – 1F

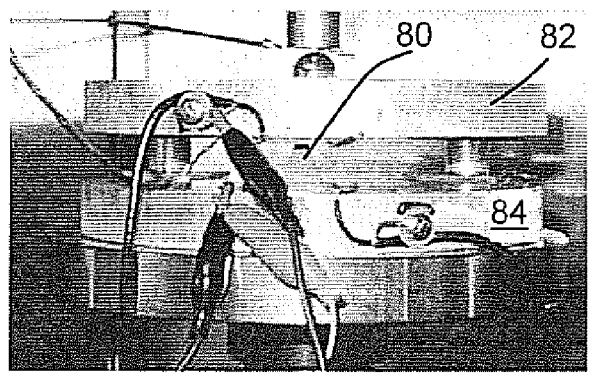
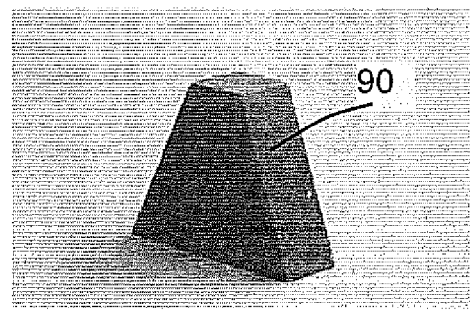
FIG – 6A   FIG – 6B
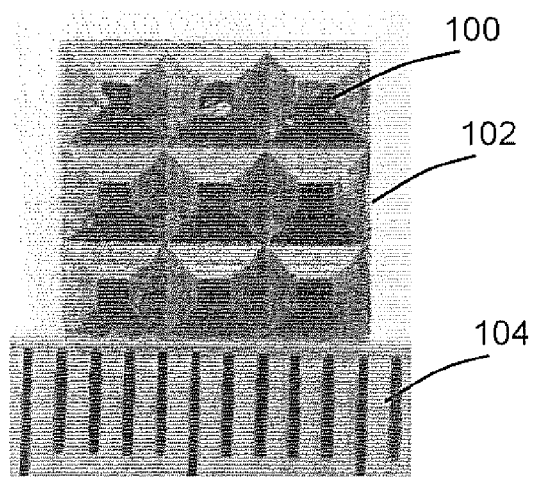
FIG – 6C

US 8,288,922 B2

FLEXOELECTRIC—PIEZOELECTRIC COMPOSITE BASED ON FLEXOELECTRIC CHARGE SEPARATION

REFERENCE TO RELATED APPLICATION

This application is a continuation-in-part of U.S. patent application Ser. No. 11/770,318, filed Jun. 28, 2007, which claims priority from U.S. Provisional Patent Application Ser. No. 60/818,164, filed Jun. 30, 2006, the entire content of each of which is incorporated herein by reference.

STATEMENT OF GOVERNMENT SUPPORT

This invention was made with government support under Contract No. N00014-06-1-1059, awarded by the Office of Naval Research. The Government has certain rights in the invention.

FIELD OF THE INVENTION

The invention relates generally to flexoelectric materials and their applications.

BACKGROUND OF THE INVENTION

Conventional piezoelectric materials produces a voltage under stress (the piezoelectric effect), and deform under an applied electric field (the converse piezoelectric effect). No material has ever been produced that shows the piezoelectric effect without also having the inverse piezoelectric effect, as the direct and converse effects are thermodynamically identical.

Further, the conventional belief is that piezoelectric materials must be non-centrosymmetric, or at least contain a non-centrosymmetric component, which severely limits the material choices available. The most commonly used piezoelectric material is lead zirconate titanate, but there are environmental and public health concerns related to the production and use of any lead-containing material. It has proved difficult to find any better material, using conventional approaches.

Piezoelectric devices have many useful applications, such as high voltage generation (e.g. gas lighters using the resulting spark), microactuators, microbalances, acoustic generators (including ultrasound generators), vibration sensors, and the like. It is impossible in conventional piezoelectrics to break the connection between direct and converse effects. It is also difficult to make either thick or thin film piezoelectrics of high sensitivity. Most current piezoceramics are based on lead containing perovskite structure compositions, and as noted above this is less than ideal. Applications would increase if improved materials were available.

The flexoelectric effect relates to an electric polarization induced by a strain gradient within a material, and the converse effect is a strain in the material induced by an electric field gradient. A flexoelectric material can be centrosymmetric, which would seem to rule out any piezoelectric effect.

The flexoelectric effect is defined by the relationship:

$$P_l = \mu_{ijkl}\left(\frac{\partial S_{ij}}{\partial x_k}\right) \quad (1)$$

where $\mu_{ijkl}$ are the fourth rank polar tensor flexoelectric coefficients,
$S_{ij}$ is the elastic strain components.
$X_k$ is the direction of the gradient in S, and
$P_l$ is the induced electric polarization.

For flexoelectricity there is also a converse effect, i.e. there is an elastic stress generated by an electric field gradient defined by the relationship:

$$T_{ij} = \mu_{ijkl}\left(\frac{\partial E_k}{\partial x_l}\right) \quad (2)$$

where $E_k$ is the electric field,
$x_l$ the direction of the gradient in E, and
$T_{ij}$ the induced stress.

For the direct effect in the MKS system, units for $\mu$ are coulombs/meter (C/m), and for the converse effect the units are Newton/volt (N/V), which are necessarily equivalent as the direct and converse flexoelectric effects are thermodynamically identical.

SUMMARY OF THE INVENTION

Examples of the present invention include apparatus and methods for obtaining an electrical signal in response to a force, and/or a mechanical actuation in response to an electric field. These responses are obtained using the flexoelectric effect.

The term flexoelectric-piezoelectric material (FP material) may be used for a material (such as a composite) exhibiting a response similar to a direct piezoelectric or converse piezoelectric effect, due to a flexoelectric effect within the material.

An example flexoelectric piezoelectric composite (FP composite) may be a composite formed from a first material and a second material, the first material having a shaped form so that an applied force induces a stress gradient in the first material, and/or an applied electric field induces an electric field gradient in the first material. A piezoelectric-like response arises from a flexoelectric effect within the first material, which may be a direct flexoelectric effect or a converse flexoelectric effect.

A flexoelectric-piezoelectric (FP) response is similar to that obtained using a piezoelectric material, but originates from the flexoelectric effect. The response may be similar to a direct piezoelectric effect, converse piezoelectric effect, or both. Remarkably, in some configurations, a direct piezoelectric-like response can be obtained without any analogous converse effect, or a converse piezoelectric-like response can be obtained without any analogous direct effect. Hence, examples of the present invention include actuators that have no sensor-like response, and sensors that show no actuation properties. Such devices cannot be obtained using conventional piezoelectric materials. An conventional piezoelectric device used as a sensor will show an actuation response, and vice versa.

An example FP composite comprises a first material, which may be centrosymmetric and substantially isotropic, the first material being present in a shaped form. The shaped form gives a piezoelectric response due to a flexoelectric effect in the first material. The shaped form may have $\infty$m symmetry, or a polar variant of this form such as 4 mm.

In some examples, the composite material has a direct piezoelectric response, the material providing an electrical signal in response to an applied force, the shaped form being chosen so that the applied force induces a stress gradient in the first material, so that the electrical signal arises from a flexoelectric effect within the first material.

In other examples, a flexoelectric composite has a converse piezoelectric response, the material providing a mechanical stress in response to an applied electrical field, the shaped form being selected so that the applied electrical field induces an electrical field gradient in the first material, the mechanical stress arising from a flexoelectric effect within the first material.

A flexoelectric piezoelectric composite may comprise first and second materials, the first and second materials having elastic constants differing by at least one order of magnitude, more particularly by more than two orders of magnitude, to facilitate a strong flexoelectric effect at an interface that is at an oblique angle (i.e. not parallel or orthogonal) to the direction of an applied force. In this example, a direct piezoelectric effect is observed, that is enhanced as a stress gradient increases.

In other examples, the first and second materials have electrical permittivities differing by greater than one order of magnitude, more particularly greater than two orders of magnitude. In these examples, a field gradient at an interface that is at an oblique angle (i.e. not parallel or orthogonal) to the direction of an applied field allows a strong flexoelectrically induced converse piezoelectric effect to be observed.

Some composite flexoelectric materials may exhibit an appreciable direct piezoelectric-like effect, but no appreciable converse piezoelectric-like effect under the same conditions as which the direct piezoelectric-like effect is observed. Other composite materials may exhibit an appreciable converse piezoelectric-like effect, but no appreciable direct piezoelectric-like effect under the same conditions as which the converse piezoelectric-like effect is observed. By suitable choice of materials, elastic constant and permittivity properties may be tailored to give direct only, converse only, or both direct and converse piezoelectric-like effects.

Apparatus including such FP materials may include sensors (e.g. using a piezoelectric-like material having a direct effect only), actuators (e.g. using a piezoelectric-like material having a converse effect only), and the like.

An example material may be a composite formed from a first material and a second material, the first material having a shaped form so that an applied force induces a stress gradient in the first material, and/or an applied electric field induces an electric field gradient in the first material, the piezoelectric response arising from a flexoelectric effect within the first material. In some examples, the first material is a ceramic, such as a paraelectric ceramic. Example first materials include barium titanate, barium strontium titanate, and the like. Example shapes include a truncated pyramid, a truncated cone, and the like. The material may be present in a layer having a thickness less than 100 microns, the shapes being generally aligned in a common direction, such as having a central axis generally orthogonal to a substrate. In some examples, a piezoelectric coefficient of greater than 100 pC/N may be obtained for layer thicknesses less than 100 microns.

BRIEF DESCRIPTION OF THE DRAWINGS

FIGS. 1A-1C show forms representing symmetry groups which allow a flexoelectric effect;

FIGS. 1D-1F show structures having symmetry groups as illustrated in FIG. 1A-1C;

FIG. 6A illustrates an experiment configuration used to evaluate a shaped form;

FIG. 6B illustrates a truncated rectangular pyramid 90 of barium strontium titanate (BST) used in some experiments;

FIG. 6C shows a photograph of a 3×3 array of BST pyramids on a BST substrate;

FIG. 9A is a front view, FIG. 9B is a 3-D view with the top stress-distributing platen removed, and FIG. 9C shows (exaggerated) deformation situation under stress creating a strong transverse stress gradient.

DETAILED DESCRIPTION OF THE INVENTION

Figure 2:
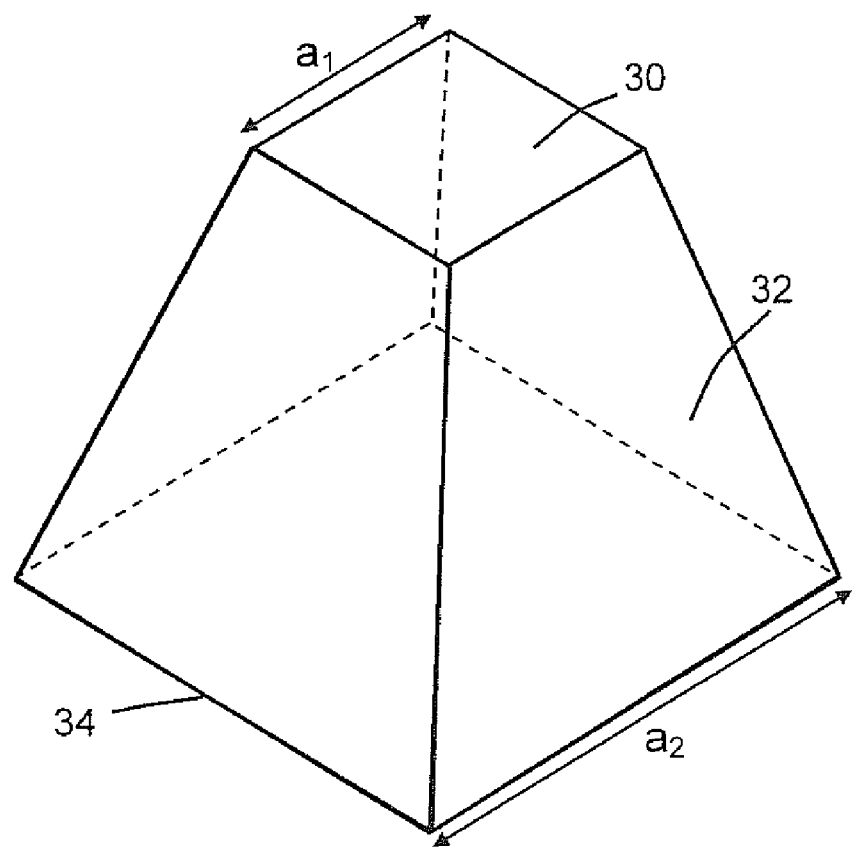
FIG. 2 shows a possible shaped form, in this example a truncated pyramid.

In the direct flexoelectric effect, an applied force induces stress gradients within the structure, leading to an electrical signal that results as a consequence of the stress gradient. The electrical signal is a flexoelectric signal. Unlike the piezoelectric effect, the flexoelectric effect requires a stress gradient. Shaped forms may be configured to provide a stress gradient on application of the force across a structure. For example, the shaped forms may be located between substrates, force applied between the substrates, and the shaped forms shaped so that stress gradients are generated therein. In some examples, the shaped forms undergo a bending or flexural deformation on application of the force. Electrodes may be located so as to collect the flexoelectric signal, for example located proximate regions of a stress gradient.

In the converse flexoelectric effect, application of an electrical field induces electrical field gradients within the structure. These electrical field gradients induce an actuating force through the flexoelectric effect, in this example the converse effect. In this case, the electrodes are preferably located so that an electrical field gradient is generated, for example due to a dielectric gradient within a shaped form, or by application of the field across a composite including components of differing dielectric constant.

In some examples, oriented shapes having at least one surface angled with respect to a force direction in a composite between two elastically dissimilar materials give rise to gradients in the elastic strain even when subjected to a uniform elastic stress, and experiments showed that this charge separation is due to flexoelectricity. Such a composite may be called a flexoelectric piezoelectric composite (FP composite), i.e. a composite showing a piezoelectric-like effect that arises from flexoelectric effects within the composite. A flexoelectric piezoelectric composite may be formed entirely from centrosymmetric materials, so the choice of materials is vast compared with conventional piezoelectric material design.

Example composite materials include a first material having a shaped form, for example a truncated pyramid. The base shape of a pyramid may be triangular, square, rectangular, or other shape. Other possible shapes include a truncated cone, or frustoconical shape. For the first time, such materials were fabricated in the form of truncated pyramid shapes of a first material in air. Other example configurations are possible.

An example material comprises shaped forms (such as cones, pyramids, prisms, wedges, or other shape providing an oblique surface angled relative to the direction of pressure, and truncated versions thereof) of a first material within a second material. The first material may be an isotropic material having no intrinsic piezoelectric properties in bulk, and the second material may be air. Other examples include shaped forms of a first solid material within a second solid material. The term flexoelectric piezoelectric material (or device) may also be used for a material (or device) exhibiting piezoelectric or converse piezoelectric effect largely due to a flexoelectric effect within a material. These materials include materials that do not include any material that is piezoelectric in bulk, the piezoelectric-like properties arising due to the form of the material(s) used.

An example composite comprises oriented shapes of a first material in a matrix comprising a second material, the two materials being elastically dissimilar. In representative examples, the first and second materials are both dielectrics, and in other examples one material may be a fluid such as air. For example, a composite may comprise air-filed conical or pyramidal voids in a solid matrix.

FIGS. 1A-1C show forms representing symmetry groups which allow FP composites, FIG. 1A illustrates the $\infty$ symmetry at 10, FIG. 1B illustrates the $\infty$m symmetry at 12, and FIG. 1C illustrates the $\infty$2 symmetry at 14. These illustrated Curie symmetry groups allow non-zero piezoelectric coefficients. FIGS. 1A and 1C show structures that may exist in right-handed or left-handed forms.

From symmetry considerations, FP composites of two dissimilar dielectrics made up in the form shown in FIG. 1B have non-zero piezoelectric coefficients, which in matrix notation take the form:

$$\begin{matrix} 0 & 0 & 0 & 0 & d_{15} & 0 \\ \\ 0 & 0 & 0 & d_{15} & 0 & 0 \\ \\ d_{33} & d_{31} & d_{31} & 0 & 0 & 0 \end{matrix} \quad (3)$$

This holds even if both dielectrics are of centric symmetry so that neither is itself piezoelectric. Symmetry alone dictates what must be present at some level, but gives no clues as to the mechanisms responsible for the effects, or whether any of the necessary coefficients will be of useful magnitude.

FIGS. 1D-1F show structures having symmetry groups as illustrated in FIG. 1A-1C, for example cones 16 between substrates such as 18, the structures of FIG. 1D being cones having $\infty$m symmetry corresponding to FIG. 1B. If such forms are arranged in an orderly manner, as in FIGS. 1D-1F, further showing twisted cones 20 and twisted cylinders 22, to form a two phase composite, and both phases are insulators, even if neither phase is piezoelectric the composite ensemble exhibits some degree of piezoelectricity. Further, if in all groups the $\infty$ axis is taken as ×3 the matrices of the non-zero piezoelectric constants are as shown in the matrix above.

For the $\infty$m symmetry, even if non-piezoelectric materials (in bulk) are used, the two phases differ in elastic properties so that a conical or pyramidal form gives rise to an axial stress gradient, even if the composite is subjected to a uniform stress. The gradient then acts through the flexoelectric effect to produce charge separation.

Symmetry only dictates what is present or absent, and gives no indication as to the magnitude of an effect. Experiments discussed herein demonstrated for the first time that flexoelectricity leads to usable piezoelectric-like properties in a properly configured composite.

Previous discussions of such symmetry groups, for example J. Fousek, L. E. Cross, and D. B. Litvin, Materials Letters, 39, 287-291 (1999) speculate on the properties of such materials. However, no practical implementation was suggested, nor was there any appreciation that properties far superior to conventional materials, in particular existing lead-free materials, were obtainable. Further, application of stresses is facilitated by truncated forms.

Example composite materials according to embodiments of the present invention include a first material having a shape, for example a truncated cone (frustoconical shape), other shape representing the symmetry of Curie group $\infty$m as shown in FIG. 1B, or other shape allowing piezoelectric coefficients within an isotropic material. Other examples include a simple 0-3 composite preserving $\infty$m symmetry. Other examples include pyramids (in particular truncated pyramids), and the like. The base shape of a pyramid may be triangular, square, rectangular, or other shape.

An example composite comprises oriented truncated pyramidal or truncated conical shapes of a first material in a matrix of a second material, where the two materials are elastically dissimilar. In representative examples, the first and second materials are both dielectrics, and the first or second material may be a fluid such as air.

Oriented shapes having at least one surface angled with respect to a force direction in a composite between two elastically dissimilar materials gives rise to gradients in the elastic strain even when subjected to a uniform elastic stress, and experiments showed that this charge separation is due to flexoelectricity. Such a composite may be called a flexoelectric piezoelectric composite, i.e. a composite showing an overall piezoelectric-like effect that arises from flexoelectric effects within the composite. A flexoelectric piezoelectric composite may be formed entirely from centrosymmetric materials, so the choice of materials is vast compared with conventional piezoelectric material design.

FIG. 2 shows a possible shaped form (or building unit) in the form of a truncated pyramid. The truncated pyramid has a top surface 30, sloping sides 32, and base 34. The base and top surface may be similarly shaped, for example as a square or rectangle. A top surface dimension $a_1$ and base dimension $a_2$ are shown. In a square pyramid, the orthogonal dimensions of the top surface and base are also $a_1$ and $a_2$, respectively.

Hence, a piezoelectric-like material is achieved using one or more shapes, such as a pyramid, cone, prism (e.g. triangular prism), or other shape, including shapes having a base with a larger area than a top surface and at least one side wall having an appreciable angle to the direction of application of force (stress and/or strain). Using smaller dimensions, for example a thickness (or pyramid height, the distance between the top surface and the base) of 250 microns or less, in particular 100 microns or less, remarkably high values of piezoelectric coefficient can be obtained.

Figure 3:
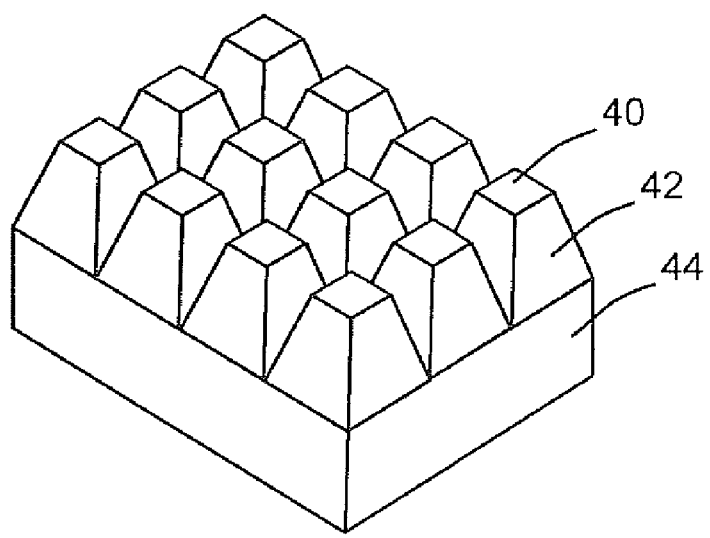
FIG. 3 shows an array of truncated pyramids on a substrate.

FIG. 3 shows an array of truncated pyramids 40 on a substrate 42. A top substrate, not shown for illustrative clarity, may also be used. Electrically conducting layers may be used to collect piezoelectric-induced charge.

The pyramids (or other shapes) may abut each other at the base or be separated. In representative examples, the pyramids may comprise a solid first material such as a ceramic. The second material, generally surrounding the sloping sides of the pyramid, may be a solid or a gas. In examples studied experimentally, the first material was barium strontium titanate, and the second material was air. In other examples, the second example may be a polymer, such as a polymer generally soft in comparison to a ceramic first material.

The upper surface of the structure, including sides and top surfaces of the pyramids, along with the lower surface of the substrate (upper and lower in reference to the illustrated orientation and not further limiting) may be coated with electrically conducting materials so as to provide first and second electrodes.

Figure 4:
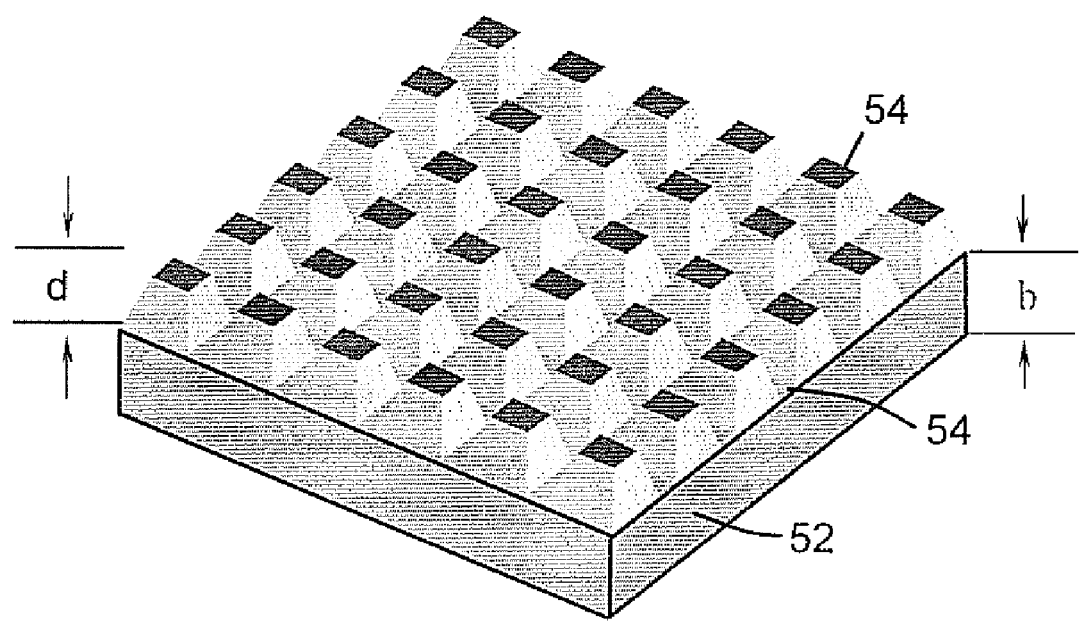
FIG. 4 shows an array of truncated pyramids supported by substrate with separation gaps between proximately adjacent pyramids.

FIG. 4 shows an array of truncated pyramids 50 supported by substrate 52, with separation gaps 54 between proximate pyramids.

Material Selection

The flexoelectric coefficients in common dielectrics are small, typically with $\mu_{ijkl} \sim 10^{-10}$ C/m. However, theoretical studies (e.g. A. K. Tagantsev, *Soviet Physics, JETP*, 61, 1246, 1986) suggest that in high permittivity dielectrics, the $\mu_{ijkl}$ could take the form:

$$\mu_{ijk1} = \gamma \chi_{k1} \left( \frac{e}{a} \right) \quad (4)$$

where γ is a constant of order unity,
$X_{kl}$ is the dielectric susceptibility,
e is the electric charge in the unit cell, and
a is the unit cell dimension.

This suggests that much higher $\mu_{ijkl}$ can be achieved in a soft mode ferroelectric like dielectrics, and this has been verified experimentally, for example as discussed in W. Ma, and L. E. Cross, *Appl. Phys. Lett.* 82, 3293, (2003).

Surprisingly, lead based compositions like lead zirconate titanate (PZT), which are excellent piezoelectrics, have γ almost one order smaller than barium based compositions like BST and BaTiO$_3$. Hence, flexoelectric piezoelectric ceramics can be lead free without compromising performance.

In barium strontium titanate (Ba$_{0.67}$Sr$_{0.33}$)TiO$_3$, $\mu_{11}$ is approximately 100 μC/m, some 6 orders larger that the typical values for conventional common dielectrics. Experiments confirmed that $\mu_{11}$ measured by both direct and converse methods for BST are identical within experimental error.

Example materials which may be used as materials in a flexoelectric piezoelectric include oxides, such as titanates, in particular barium titanate, strontium titanate, barium strontium titanate (BST), other titanates, and other oxides. Example materials include high-K ceramics. Example materials include compounds of barium, compounds of strontium, compounds of zirconium, and the like. In other examples, polymers may be used as one or both of the components of a ferroelectric piezoelectric composite.

Other paraelectric perovskite structure ceramics have large values of flexoelectric coefficients $\mu_{11}$, $\mu_{12}$, and are good choices for a material used in a piezoelectric-like composite.

Fabrication and Characterization of a Flexoelectric Composite

A material was fabricated, and piezoelectric measurements obtained, for a millimeter scale flexoelectric piezoelectric (FP) composite designed to have an easily measurable piezoelectric coefficient $d_{33}$, and an easily calculable $d_{33}$ response, induced by a flexoelectric origin, from the known flexoelectric and elastic properties of the constituent phases. The existence of a measured piezoelectric-like response was demonstrated, and showed experimental evidence that the charge separation mechanism involved is flexoelectricity.

A flexoelectrically driven piezoelectric composite was constructed from barium strontium titanate (BST) and air. Both components of the FP composite are centric dielectrics, the first time a piezoelectric-like response has been made obtained without a non-centrosymmetric component. The material has appropriate shaped internal surface configurations such as illustrated in FIG. 1. The material demonstrated a clear piezoelectric-like signal as measured on a conventional Berlincourt $d_{33}$ meter.

Barium strontium titanate was chosen as strong flexoelectric component, Ba$_{0.67}$Sr$_{0.33}$TiO$_3$. To generate a strong $S_{3(1)}$ strain gradient, a close packed 3×3 array of millimeter scale square truncated pyramids was cut into the flat face of a BST ceramic sheet. The pyramid surfaces and the obverse side of the BST sheet were sputter coated with gold electrodes, and a robust stress distributing brass electrode was mounted on the upper surface of the pyramid array with conductive silver epoxy. Hence, a practical piezoelectric demonstrator was fabricated from BST ceramic at the (Ba$_{0.67}$Sr$_{0.33}$)TiO$_3$ composition, which had a measured $\mu_{11}$=120 μC/m at 25° C.

Figure 5A:
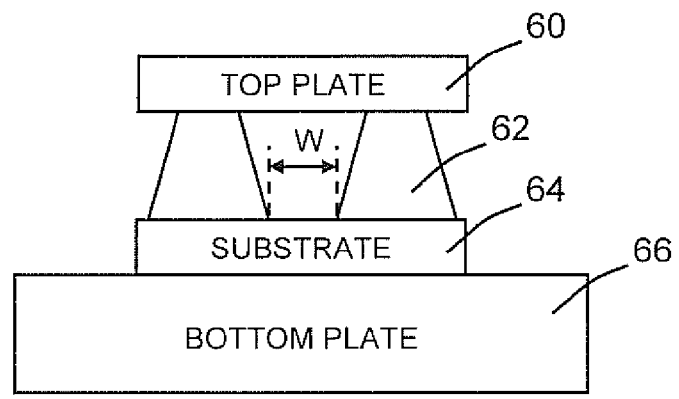
FIGS. 5A-5B show stress gradients induced in shaped forms.

FIG. 5A illustrates a configuration used to evaluate piezoelectric materials. The configuration shown includes top plate (first substrate) 60, FP material comprising pyramidal shapes 62, substrate 64, and bottom plate (second substrate) 66.

For converse piezoelectric effect evaluation, the top and bottom plates both comprised polished glass, and a laser interferometric method was used to detect dimension changes on application of an electric field. The optional substrate 64 may comprise the same material as the pyramids 62, or otherwise be used for growth, formation, and/or support of the pyramids.

For direct piezoelectric effect evaluation, the top and bottom plates were pressure surfaces such as metal, and were used to apply stress to the materials, with electrical signals detected between electrodes in contact with the base and top surface and sides of the pyramid shapes.

Figure 5B:
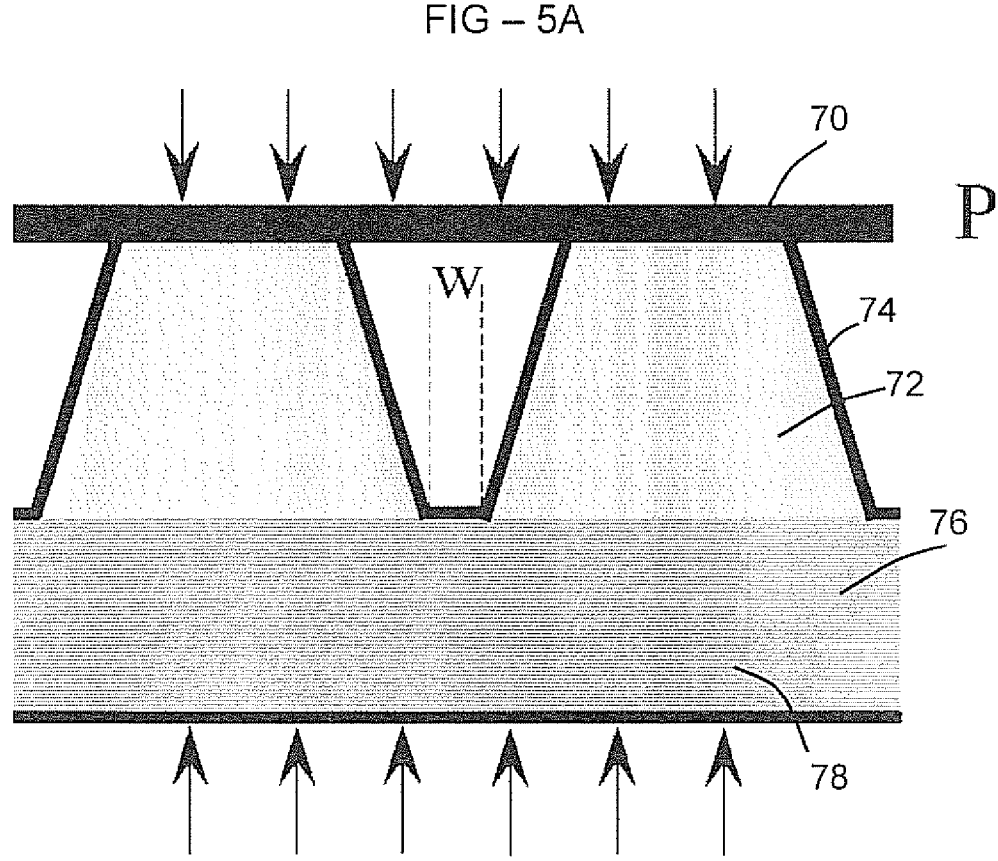

FIG. 5B shows a configuration for $d_{33}$ measurement, using a top metal plate 70, pyramids (in cross-section) 72, upper electrode 74 shown as a thick black line, substrate 76, and lower electrode 78. The arrows indicate application of stress.

FIG. 6A illustrates an experiment used to evaluate a pyramidal shape 80, between upper and lower pressure plates 82 and 84 respectively.

FIG. 6B illustrates a truncated rectangular pyramid 90 of barium strontium titanate used in some experiments.

FIG. 6C shows a photograph of a 3×3 array of BST pyramids 100 machined from a 1.28 mm thick block, leaving a 0.52 mm thick BST substrate 102. The top view of the structure was photographed against a millimeter scale 104. For experiments with this structure, for uniform stress distribution a 1 mm thick aluminum laten covered the upper face. Since under uniform applied stress the axial strain gradient extends down the slanting pyramid faces, the whole upper surface was platen with sputtered gold.

For piezoelectric measurements, a piezoelectric material was placed between the contacts of a standard Berlincourt $d_{33}$ meter (model ZJ-2), which uses an elastic drive signal at 100 Hz and compares the piezoelectric output to that of a built in PZT standard. To establish the confidence level a rectangular block of BST at the same composition was measured in the $d_{33}$ meter yielding the value 0.4 pC/N.

An experiment was performed with a material as shown in FIG. 6C, using the set-up of FIG. 5B, having a 3×3 array of truncated pyramids having dimensions $a_1=1.13$ mm, $a_2=2.72$ mm and pyramid height, $d=0.76$ mm. The gap spacing W was 190 microns. The materials were evaluated for up and down orientations of the pyramids in the Berlincourt meter, giving values of $d_{33}$ of 6.0 and 6.3 pC/N respectively. The differences may be due to different stress distributions in the two experimental configurations. These results were corrected for capacitance effects. The temperature was 24° C., where BST was in the paraelectric state.

Assuming flexoelectricity as the origin of the piezoelectric-like response, the relation between $d_{33}$ and $\mu_{11}$ for an axial stress gradient in the composite takes the form $$d_{33} = \frac{\mu_{11} \nabla_3 T_3}{c_{11} T_3^1} \tag{5}$$

where $\nabla_3 T_3$ is the axial stress gradient in the ceramic,
$T_3^1$ the uniform axial stress applied to the composite, and
$C_{11}$ the elastic constant of the ceramic.

Using a finite element method to calculate the gradient, a calculated $d_{33}=6.0\pm1$ pC/N was determined for the same sample. The experimental results proved that the composite has a piezoelectric-like response, in spite of the fact that all component elements are centric, which forbids piezoelectricity unless the shape has special symmetry forms discussed above in relation to FIG. 1A-F. This is the first time such a composite has been made. The agreement of experimental and theoretical results confirms that flexoelectricity is the origin of the observed piezoelectric-like effect in these materials.

Enhanced Piezoelectric-Like Effect at Small Dimensions

A dramatic enhancement of the piezoelectric-like effect is possible at smaller dimensions. For example, using a square truncated pyramid as the element in a composite, the upper square face has a side of length $a_1$, and the base dimension length is $a_2$, as shown in FIG. 2. In this example, the side wall 32 is configured so that $a_2$ is a linearly increasing function of d, the depth from $a_1$ to $a_2$. For a force F applied normal to the upper and lower surfaces, the stress in the upper surface will be $T_{3(1)}=F/a_1 2$ and will give rise to a strain $S_{3(1)}$ given by $S_{3(1)}=F/a_1^2 c_{11}$, where $c_{11}$ is the elastic constant of the truncated pyramid.

Similarly for the lower surface, $T_{3(2)}=F/a_2^2$, giving rise to a strain $S_{3(2)}$ given by $S_{3(2)}=F/a_2^2 c_{11}$.

Since the side walls are configured to make $a_2$ a linear function of d, $$\frac{\partial S_3}{\partial d} = \frac{S_{3(1)} - S_{3(2)}}{d} = \frac{F\left(\frac{1}{a_1^2} - \frac{1}{a_2^2}\right)}{d c_{11}}. \tag{6}$$

If the pyramid material has a flexoelectric coefficient $\mu_{11}$, then $$P_3 = \mu_{11} \frac{\partial S_3}{\partial d_3} \tag{7}$$

$$= \mu_{11} \frac{F\left(\frac{1}{a_1^2} - \frac{1}{a_2^2}\right)}{dc_{11}}$$

$$= \mu_{11} \frac{\frac{a_2^2 - a_1^2}{a_1^2}}{dc_{11}} \cdot \frac{F}{a_2^2}$$

i.e., $$P_3 = \mu_{11} \frac{\frac{a_2^2 - a_1^2}{a_1^2}}{dc_{11}} T3 \tag{8}$$

but for a piezoelectric sheet:

$$P_3 = d_{33} T_3, \tag{9}$$

so that:

$$d_{33} = \mu_{11} \frac{\left(\frac{a_2^2 - a_1^2}{a_1^2}\right)}{dc_{11}} \tag{10}$$

For BST at room temperature $\mu_{11} \sim 100$ µC/m, and $c_{11}=1.66\times10^{11}$ N/m. For $a_1=50$ µm, $a_2=250$ µm, $d=250$ µm, then $d_{33} \approx 60$ pC/N. Scaling down, for example, $a_1=5$ µm, $a_2=25$ µm, $d=25$ µm, and then $d_{33} \approx 600$ pC/N. This value is remarkably high, and is achieved with readily achieved dimensions.

Because they are gradient driven, the piezoelectric coefficient $d_{33}$ will increase linearly with decreasing composite thickness (i.e. pyramid height, d), for example:

| | |
|---|---|
| Millimeter scale | 6 pC/N |
| 100µ scale | 60 pC/N |
| 10µ scale | 600 pC/N |
| 1µ scale | 6,000 pC/N |

These are representative values, which vary with material and exact configuration. Macro-scale device thicknesses can be obtained using a multilayered micron-scale thickness layers.

In conventional composite piezoelectrics, the piezoelectric activity decreases markedly as the piezoelectric dimensions are reduced into the micron range. Both thick and thin film materials have reduced $d_{ij}$ constants. In contrast, in the FP materials and apparatus according to examples of the present invention, the response increases as the dimensions are reduced because charge separation is gradient driven.

For a properly designed square pyramid, the uniform stress gradient $T_{3(1)}$ steepens (increases) with decreasing scale as 1/d, where d is the pyramid height. Hence, for a BST flexoelectric piezoelectric composite, a value of $d_{33}$ comparable to that of lead zirconate titanate is expected to be at the micrometer scale.

Figure 7:
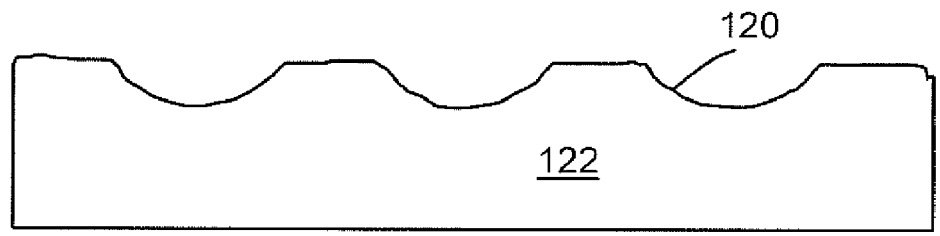
FIG. 7 shows a profile obtained by machining a ceramic at micron scale using an insufficiently hard blade.

Two composites were fabricated to have a form as shown in FIG. 4. For the first composite, the pyramid height d and substrate thickness b were both 50 microns, and the gap spacing between pyramids was 29 microns ("W" in FIG. 5). For the second composite, pyramid height and substrate thickness were both 100 microns, and gap spacing was 28 microns. Preliminary results for the converse piezoelectric-like effect, using polished glass top and bottom plates and an interferometric technique, indicated $d_{33}$~50 pC/N for the first composite and 25 μpC/N or the second composite. The profile of the second ceramic, shown approximately at 120 in FIG. 7 on substrate 122, do not curve in the desired manner due to bending of the cutting blades (designed for biological materials) in the ceramic. However, these results show the general trend expected from theory, showing that piezoelectric coefficient greater than 100 pC/N may be obtained using device structures having dimensions in the tens of microns.

Independent Control of Direct and Converse Piezoelectric-Like Effects

As the charge separation is gradient driven, it is possible to design composites where uniform stress will drive large strain gradient leading to strong direct piezoelectric-like effects. However, in the same materials, a uniform field will not generate strong field gradients, giving no converse piezoelectric-like effect.

In some examples, a uniform electric potential difference will generate strong electric field gradients, but a uniform stress will not generate large strain gradients, leading to a composite with strong converse piezoelectricity but no direct piezoelectric-like effect.

In some examples, materials are fabricated in which the piezoelectric-like response is generated by flexoelectric properties of a first material. The first material can be chosen so as to have large flexoelectric coefficient, and shapes for these first materials chosen so that when properly mutually oriented with respect to a second material, the material converts a uniform applied elastic stress (or electric field) into a strong internal electric field gradient (or elastic stress gradient) in the first material, which may be considered as the active flexoelectric phase.

The second material can be chosen to have a high compliance constant and a low dielectric permittivity relative to the first component. Resultant electric polarization due to applied stress (or elastic stresses due to applied fields) are summed to generate the piezoelectric-like effect resulting from the Curie group symmetry of the composite. If the dielectric properties of the first and second materials are matched, under a uniform electric field applied to the composite, no electric field gradient will occur in the flexoelectric component; thus no flexoelectric stress will be generated, and consequently no converse piezoelectric-like effect will appear in the composite. However, if the elastic properties of the two component phases are simultaneously drastically mismatched, then under a uniform elastic stress applied to the composite, a strain gradient will appear in the flexoelectric component that will generate an electric polarization, and consequently the direct piezoelectric-like effect will appear in the composite.

A material according to embodiments of the present invention allows independent control of direct and converse piezoelectric-like effects. Hence, devices may be configured to show the direct effect but not the converse effect, or vice versa, or any desired combination of direct and converse effect magnitudes. Hence, devices according to the present invention include sensors that do not actuate, unlike any conventional piezoelectric sensor, and actuators that do not sense. This is a very useful separation of functions that allows novel smart materials to be designed. Independent control of direct and converse effects allows design of new smart materials for acoustic signature and vibration control. Compact highly active FP composites facilitate new MEMs applications in robotics and unmanned vehicles.

For sensor-only applications (converse effect only), a composite may be made from components having similar elastic constants, but different dielectric properties. For example, cones of a high dielectric material may be arranged in a low dielectric material.

Hence, for the first time, materials according to embodiments of the present invention may be designed to provide sensing without actuation, or actuation without sensing. For the first time it will be possible to make piezoelectric-like sensors which will not actuate and piezoelectric-like actuators which will not sense. These are useful for smart system applications and noise control. Either the piezoelectric effect only, the converse piezoelectric effect only, or both can be obtained using suitable material choices.

Frequency and Temperature Dependent Effects

The direct and converse piezoelectric-like effects for a flexoelectric piezoelectric composite are influenced by temperature and frequency effects of permittivity and elastic properties. Hence, a material may be designed that shows only the one effect at a predetermined temperature or frequency, and the other effect (or combination of effects) at a second temperature or frequency.

For example, at frequencies above dielectric relaxation of a first component, the permittivity may then match that of a second component, so that no converse piezoelectric effect is observed from a composite.

For example, at temperatures above a glass transition, melting transition, or other transition of one component, elastic mis-match of two components may be achieved (or removed), allowing a strong direct piezoelectric-like effect (or elimination of such effect).

Other examples will be apparent to those skilled in the art.

Further Examples and Discussion

Embodiments of the present invention include composites that do not include a centrosymmetric material, or at least in which the piezoelectric-like effect does not arise from the piezoelectric properties of any single component.

Figure 8:
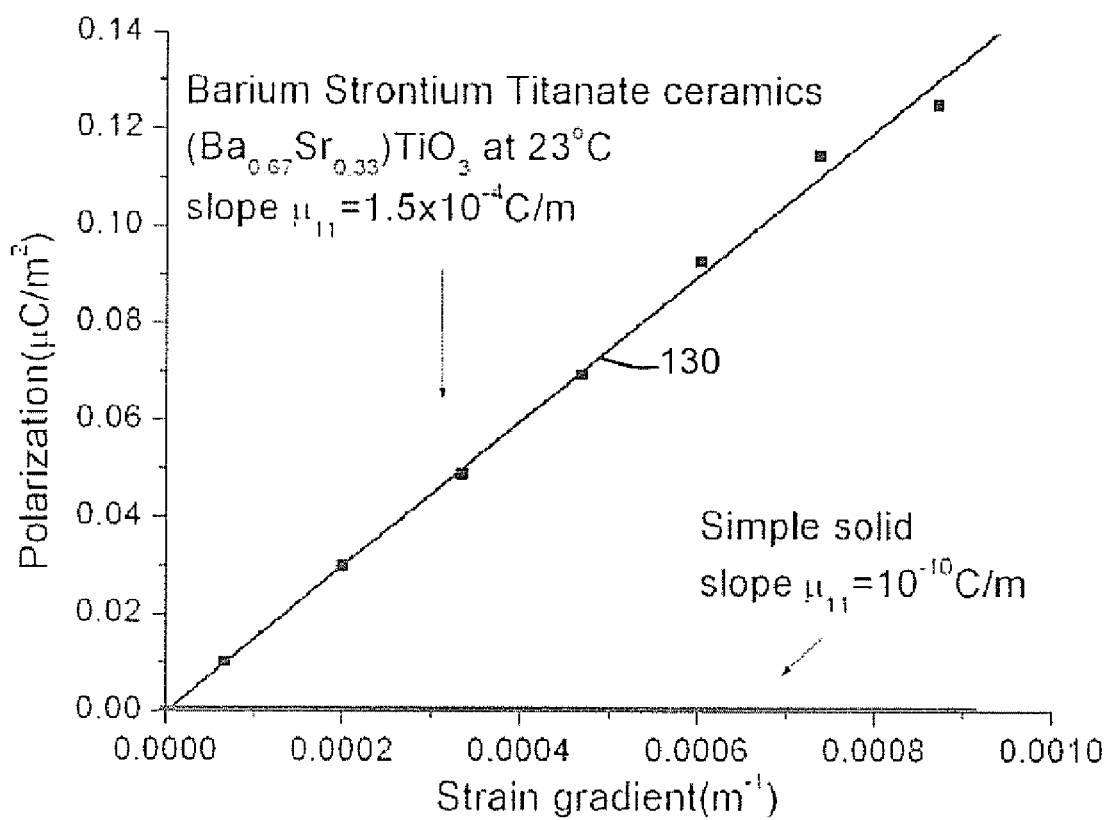
FIG. 8 further illustrates the effect of flexoelectricity in obtaining a piezoelectric effect.

FIG. 8 shows a configuration for measuring the flexoelectric coefficients, as the flexoelectric coefficient can be determined from the slope of the data curve obtained. This further demonstrates the effect of flexoelectricity in obtaining a piezoelectric-like effect. Strain gradients can be obtained using bending of the shaped forms, and bar-bending experiments can be used for material evaluation purposes.

Examples include composites of two or more components, including a first material and a second material. The first and second materials have an interface inclined at an oblique angle to the direction of obtained electric field. In some examples, the first material is in the form of a cone, frusto-conical shape, pyramids, truncated pyramid, triangular prism, other geometrical or non-geometrical shape, or mixture thereof There may be one or more such shapes in the composite material. In some examples, the shapes are oriented, and/or are arranged in a regular array.

The term "composite", as used here, includes composites where the second material is air, so that there is only a single solid component, that is shaped as desired. The desired shapes may be formed by molding, cutting, or other physical, chemical, and/or mechanical process. Deformation of a multi-component composite after formation may be used to obtain or improve desired interface orientations.

In other examples, composites may comprise two or more solid dielectric materials. Other combinations are possible, including solid/solid, solid/gas, solid/liquid, and solid/liquid crystal. Solids include crystalline, amorphous, ceramic, glass, polymer, or other materials. One or both materials may be porous, or otherwise contain voids. Example materials include strontium titanate, barium titanate, and Z5U dielectrics.

The composite material may be sandwiched between parallel electrical conducting plates, an electrical potential being obtained between the plates when a stress is applied normal to the plates. An electrical field can be obtained even where the composite is entirely centrosymmetric and there are no stress gradients in the externally applied stress. The composite may include a plurality of shapes of a first material dispersed through a second material. The composite may include two or more components.

In some embodiments, the composite includes at least two materials that are two materials are elastically dissimilar, such as an elastic modulus one or more orders of magnitude different. The two materials have an interface configured so as to generate a flexoelectric electric field having a component along a desired direction.

In other examples, a piezoelectric-like device may be formed by a material according to the present invention between a pair of substrates. The substrates may be metal plates, electrode layers, or other electrically conducting materials, for example as previously described, or one or both may be non-conducting. Separate components may be used for application of pressure to a device, and collection of electrical signals. There may be a conducting layer disposed on e.g. the surfaces of cones or pyramids of the first material at which the electric potential is developed.

The angle of the sloping sides, e.g. the cone angle of conical shapes, may be adjusted to maximize the signal while allowing stress propagation. The optimum angle depends on the materials used.

At present, lead zirconate titanate (PZT) is superior to other ceramic piezoelectrics, and dominates commercial applications despite the lead content. At present, there is no competitive conventional lead-free competitor. However, embodiments of the present invention include lead-free composites with piezoelectric-like properties comparable to PZT.

Further, PZT does not retain its excellent properties in thin film form. In contrast, flexoelectrics are gradient driven and improve as they become thinner. Composites according to embodiments of the present invention are excellent for MEMS and high frequency ultrasound applications.

In conventional materials, direct and converse effects are thermodynamically equivalent and are always equal. In the gradient driven systems, strain and field gradients can be independently tailored to break the thermodynamic equivalence. Hence, direct, converse, or some combination of effects are achievable.

Example apparatus include substrates, configured to receive a compressive or tensile force therebetween, and shaped forms. Application of a force to the substrates induces a stress gradient within the shaped forms. Electrodes located proximate, preferably adjacent, the regions of maximum stress gradient allow an electrical signal to be detected that arises as a result of the flexoelectric effect in the shaped form.

In some examples, the shaped forms have an effective cross sectional area that changes along a direction parallel to the force, creating a stress gradient within the element. The stress may be greatest in a constricted region, for example near the apex of a pyramid. Conversely, the stress may be minimal near the base of the pyramid or similar structure. Hence, a stress gradient is generated between the regions of higher stress and regions of lower stress. By reducing the dimensions of the shaped forms, the stress gradients can be increased as the gradient is equal to the difference between maximum and minimum stress within an element divided by the distance between them.

In some examples, the shaped form takes the shape of a sheet, strip, or other elongated form that undergoes a flexural or bending deformation on application of a force to the substrates. For example, for an elongated element, the force may be directed perpendicular to the direction of elongation. Such a force will tend to bend a rod, or distort a sheet from a generally planar configuration. Bending of the shaped forms induces compression within the inside radius of curved portions, and tends to induce extensions within the outer radius. Hence a stress gradient occurs between the inner surface and outer surface.

In some examples, sheets or other generally planar forms are located between parallel substrates, so that the sheets are generally parallel to the substrate. On application of a force between substrates, distorter elements are urged into the sheets, inducing a flexural deformation of the sheet.

Flexural Mode Device

A flexural mode composite was designed that allows large transverse strain gradients to be generated through a flexural distortion (or bending distortion) of a shaped form. The shaped form may be a sheet, strip, rod, ring, or other form. A first electrode may be located adjacent a portion of the shaped form under compressive stress, and a second electrode located adjacent a portion of the shaped form under tensile stress.

In some examples, one or more distorter elements are used to induce the flexural deformation of the shaped form. In examples below, the distorter elements are wires, but this is not limiting. When a force is applied to the substrates (which may be stress-distributing latens), this urges the distorter elements against the shaped form, inducing the flexural deformation.

Examples below exploit the large flexoelectric coefficient $\mu_{1122}$ of $(Ba,Sr)TiO_3$ (BST) ceramics, but other materials can be used.

A very strong direct FP effect was observed in composites due to the flexoelectricity of BST. In a single unit composite, sharp low frequency (<300 Hz) mechanical resonance leads to high effective $d_{33}$>2000 pC/N as the result of enhancement of strain gradient at resonance. Giant non-resonance effective $d_{33}$ well beyond piezoelectric single crystal about 4350 pC/N was measured at a temperature near the Curie temperature of BST ceramic in a six unit three layer composite.

Barium strontium titanate electroceramics, in particular the $(Ba_{0.67}Sr_{0.33})TiO_3$ composition, have the largest $\mu_{ijkl}$ constants yet measured, and $\mu_{1111}$ and $\mu_{1122}$ have similarly very high values. Flexure (bending) of thin sheets can generate very strong transverse $S_{22}$ gradients.

Figure 9A:
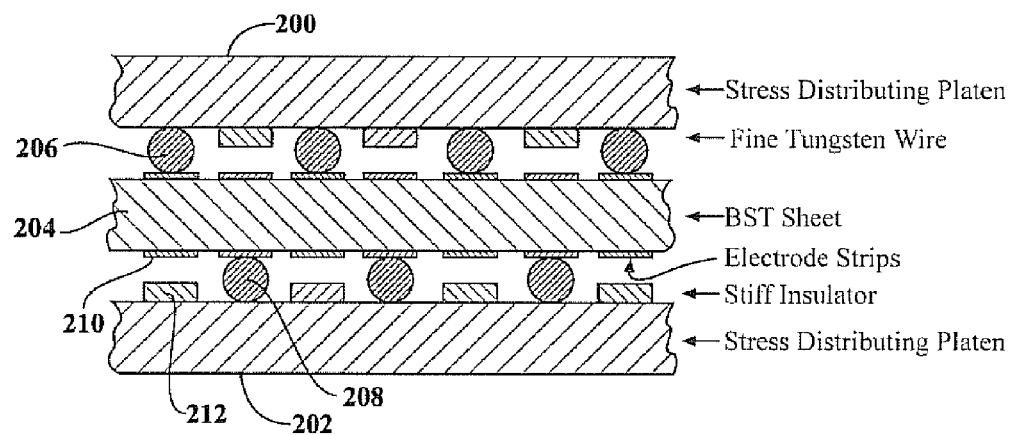
FIGS. 9A-9C shows a cross section of a simple one layer BST device using fine tungsten wire to induce strong transverse strain gradient producing polarization under the stripe electrodes through flexoelectric $\mu 12$, where
Figure 9B:
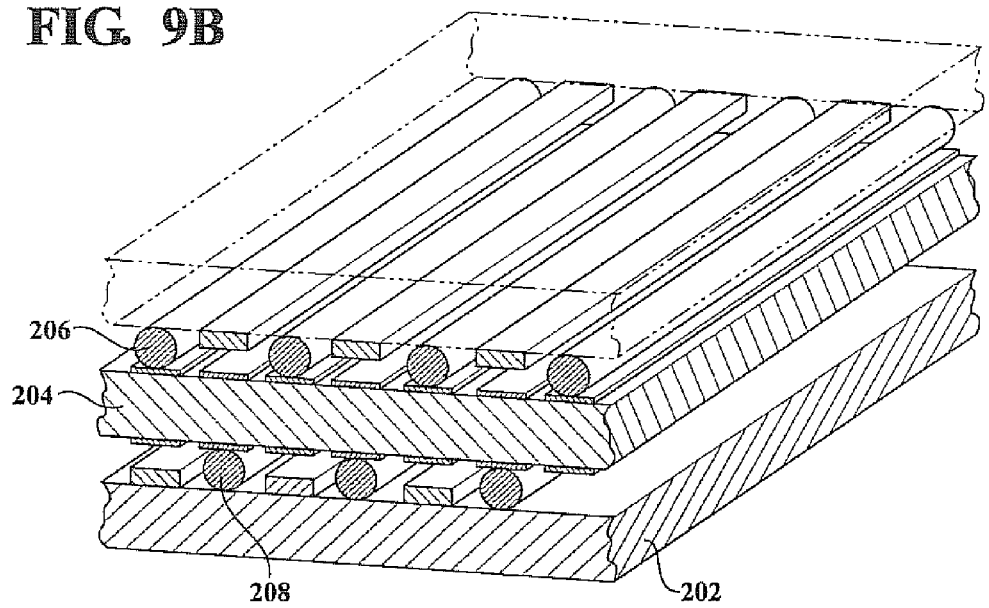
Figure 9C:
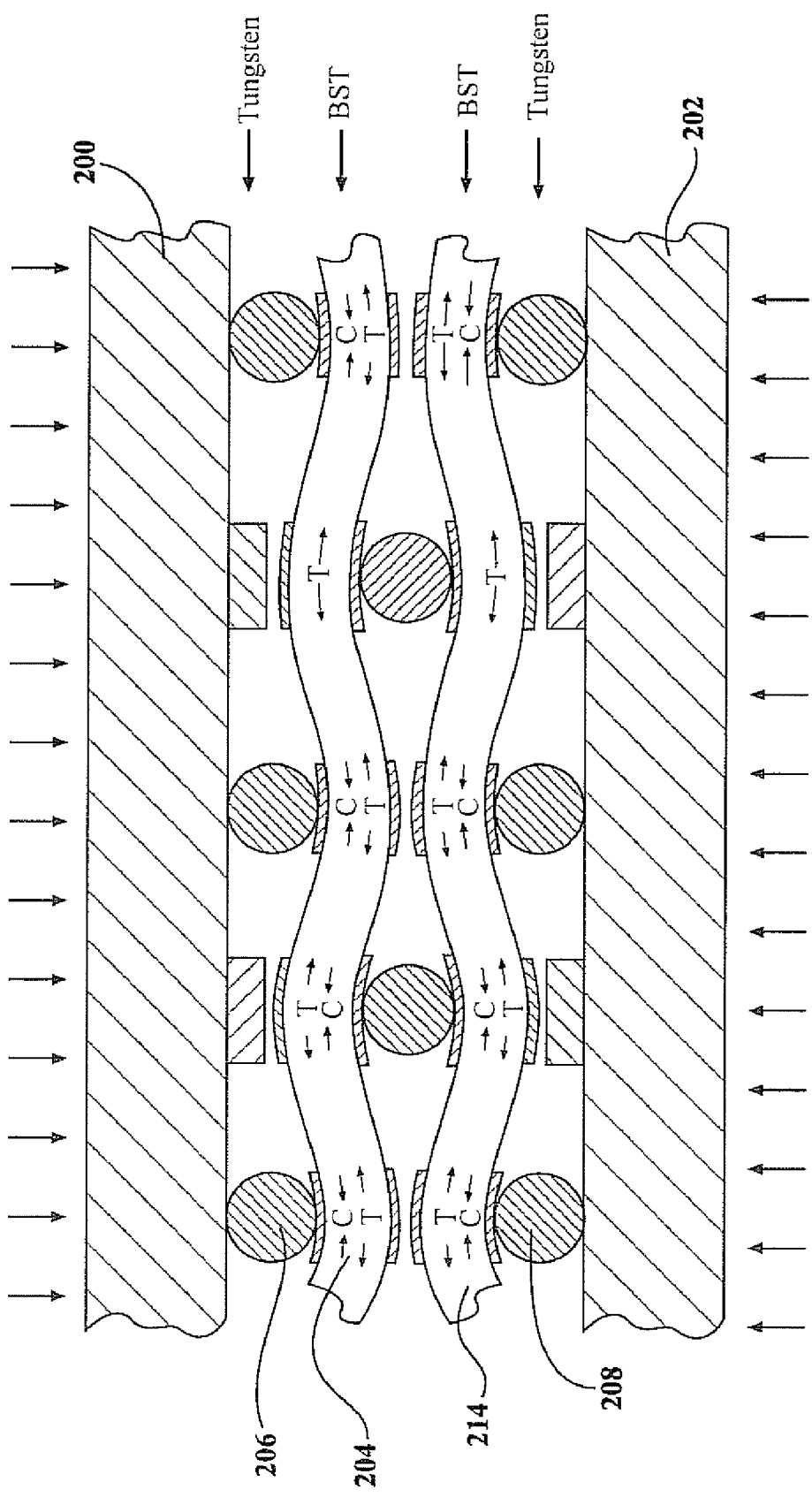

FIGS. 9A-9C illustrate an example configuration, illustrating generation of strong local curvatures in thin ceramic sheets. A comb-like arrangement of thin metallic wires shown in elevation in FIG. 9A and in perspective in FIG. 9B interleaves the sheets and focuses the stress applied to light but rigid stress distributing platens above and below the active flexoelectric ceramic bars.

FIG. 9A shows an apparatus comprising substrates 200 and 202, with shaped form 204 located therebetween. In this example, the shaped form is a thin sheet, for example comprising barium strontium titanate. The distorter elements 206 and 208 are urged against the shaped form when a compressive force is applied between the substrates. This induces a distortion of the shaped form, shown in more detail in FIG. 9C discussed below. The apparatus also includes optional dielectric stop 212, configured to avoid short circuits between the electrodes 210 and the substrates.

The electrodes are located adjacent regions of maximum stress gradient within element 204 as the force is applied between the substrates. The electrodes may be stripe electrodes extending normal to the plane of illustration. In this case elements 206 and 208 were formed using tungsten wire, however other wires and indeed other elongated elements may be used.

In this example, the apparatus comprises a first substrate, a first array of spaced-apart distorter elements (here, wires), a dielectric sheet, second array of spaced-apart distorter elements (here, wires) and a second substrate. Looking along the sheet, the distorter elements alternate between each side of the sheet. Electrodes, adjacent opposed sides of the sheet, are located proximate each distorter element, as the stress gradient is high at these locations. In this example, a wire is adjacent one of a pair of electrodes disposed on opposed surfaces of the sheet.

In other examples, the inner surfaces of the substrates may be shaped so as to induce the flexural deformation of the element 204, protrusions from the surface acting as distorter elements.

FIG. 9B is another view of a device illustrated in FIG. 9A. In this illustration, the upper substrate 200 is removed, allowing an improved view of the wires 206 and electrode configurations.

FIG. 9C shows a slightly modified configuration including two shaped forms 204 and 214. FIG. 9C shows the expected curvature generated in exaggerated form. Strip electrodes sense the polarization generated by the steep gradient in $S_{22}$ between upper and lower ceramic surfaces. The principle of operation is similar to that described above. As a compressive force is applied between the upper and lower substrates, the distorter elements are urged in a direction perpendicular to the plane of the shaped forms 204 and 214.

As shown in exaggerated fashion, this induces a flexural deformation of the shaped forms. As shown, the flexural deformation is similar to a corrugation of the sheet, as the sheet tends to bend around each distorter element where the distorter element contacts the sheet. First and second electrodes are located adjacent a region of high compressive stress and a region of high tensile stress, respectively. Hence, the electrodes are located at regions of high stress difference. The electrodes are separated by the thickness of the sheet, giving a high stress gradient for thin sheets. The sheet thickness may be low, for example less than 1 millimeter and in particular less than 0.1 millimeters. The electrodes may be deposited as metal strips on the sheets, or other shaped forms, by any appropriate process.

Construction of an example apparatus operating using the flexural mode is relatively straightforward, and sheet thickness, wire spacing, layer count and electrode pickup can all be varied widely.

As a guide to initial choice for specific requirements, the system can be modeled as an ensemble of simple cells comprising of end supported center driven flexing beams. Simple algebraic solutions for the performance of such units are available and finite element analysis shows that surprisingly good performance is obtained, despite the apparently unusual choices of length to width ratios of some examples. Analysis and measurements on a range of simple single and multi-cell structures validate this approach.

The FP components of the constructed composites are $Ba(Sr,Ti)O_3$ ceramic bars (Texas Instruments). The dielectric constant of the materials at room temperature is about 7000 and the maximum dielectric constant is about 20,000 at a Curie temperature of 34° C. The flexoelectric coefficient of this material was measured about 6-10 μC/m at room temperature. The effective piezoelectric constant $d_{33}$ was measured directly by a Berlincourt $d_{33}$ meter (Channel Products, Inc.). The measurement frequency range was from 20 Hz to 320 Hz.

Figure 10A:
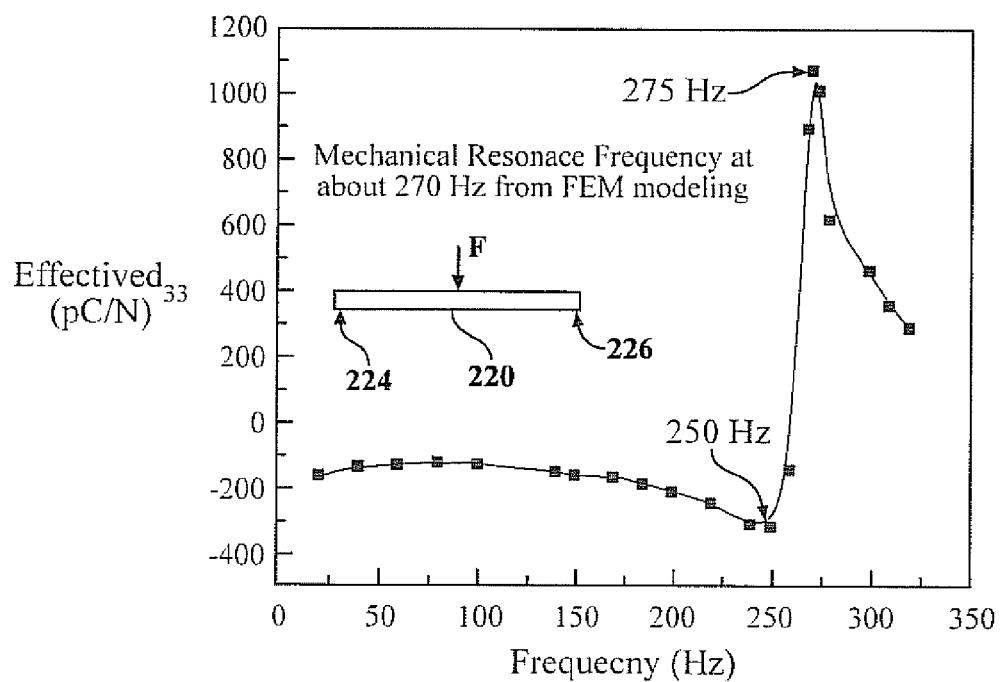
FIG. 10A shows the effective $d_{33}$ as a function of frequency of a single unit flexure composite.
Figure 10B:
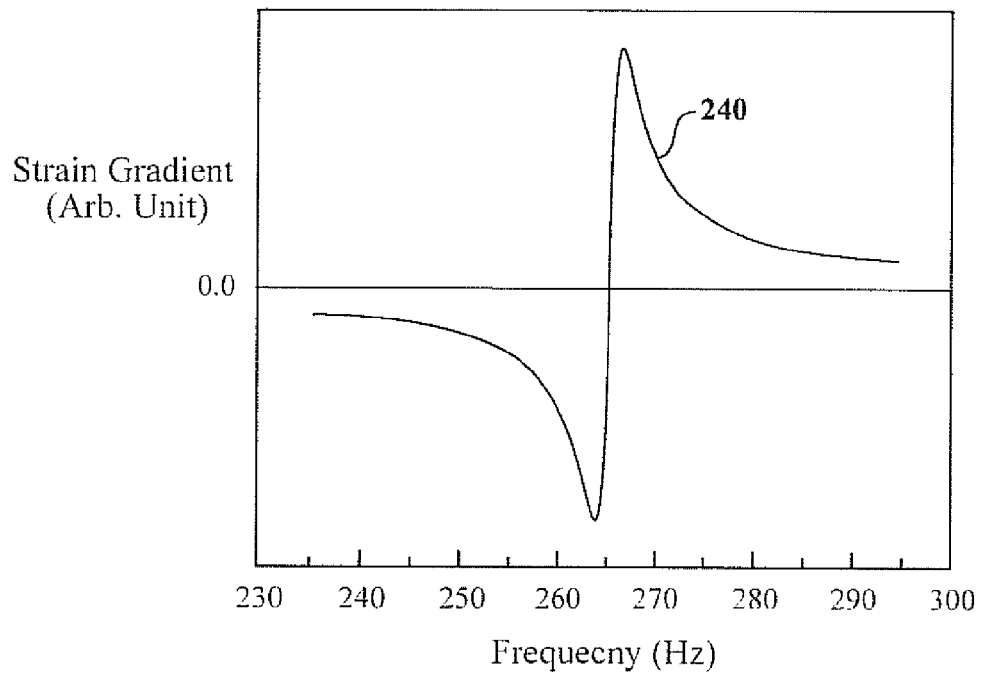
FIG. 10B shows the calculated frequency dependence of transverse strain gradient (zero phase) of a single unit flexure composite by finite element analysis.

FIGS. 10A and 10B illustrate the mechanical resonance. A structure such as illustrated in FIGS. 9A-9C may be modeled in terms of a single shaped form portion 220 supported between two distorter elements 224 and 226. The effective d33 curve, representative of the electrical signal, shows a strong dependence on the frequency of the applied force. A sharp resonance at 275 Hz is observed. FIG. 10B shows the strain gradient in arbitrary units as a function of frequency.

FIG. 10A shows frequency dependence of the effective $d_{33}$ of a single unit flexure composite at room temperature. The BST ceramic bar in the composite is 45 mm long, 11 mm wide and 0.67 mm thick, and a weight of 0.1 N was applied on the center of ceramic bar to simulate the pre-applied force during the d33 measurement.

Below 175 Hz, the effective $d_{33}$ of the composite is almost a constant about 180 pC/N. Due to the bending of ceramic bar, large strain gradient can be generated. The resultant electric polarization from flexoelectric phenomenon can be written as:

$$P_3 = \mu_{12}\frac{\partial S_{22}}{\partial x_3} + \mu_{11}\frac{\partial S_{33}}{\partial x_3} \quad (11)$$

where $\mu_{11}$ and $\mu_{12}$ are the matrix notation for $\mu_{1111}$ and $\mu_{1122}$, respectively, $P_3$ is the electric polarization in the thickness direction, $S_{22}$ and $S_{33}$ are the strain along length and thickness directions, and $x_3$ is the thickness direction. Assuming that the ceramic bar is a simply supported structural beam, the effective $d_{33}$ of single unit composite can be expressed:

$$d_{33} = \frac{3(\mu_{12} - \lambda\mu_{11})L^2}{2h^3 c_{11}} \quad (12)$$

where L is length of beam, h is the thickness, λ is the Poisson ratio of ceramic (assumed λ=0.33), and $c_{11}$ is the elastic constant of the ceramic (where $c_{11}=2.2671 0^{11}$ Pa). Assuming $\mu_{11}$ and $\mu_{12}$ are equal, a flexoelectric coefficient about 6 μC/m is determined from the measured $d_{33}$, which is consistent with the measurement result mentioned above.

Above 175 Hz, the absolute value of $d_{33}$ increases with frequency, reaches an extreme value at about 250 Hz, and then abruptly changes from the negative extreme value to a positive extreme value at about 275 Hz, at which a maximum $d_{33}$ about 1100 pC/N was measured. The measured $d_{33}$ of the composite is higher than that of PZT-based ceramics and close to the performance of some piezoelectric single crystals.

To explain the abrupt change of $d_{33}$ around 270 Hz, the frequency response of mechanical vibration of the ceramic bar with the same dimensions as the one used in the composite was calculated by finite element analysis.

As shown in FIG. 10B, the zero phase strain gradient shows the similar frequency dependent behavior as the $d_{33}$ shown in FIG. 10A. Therefore, the abrupt change of strain gradient is caused by the mechanical resonance. At resonance frequency, the strain and strain gradient of the mechanical vibration was greatly enhanced, and hence the effective $d_{33}$. The change of the $d_{33}$ value from negative to positive is due to the phase reversal at the resonance frequency of the mechanical vibration. The enhancement of the effective $d_{33}$ at mechanical resonance frequency suggests that the measured $d_{33}$ is from the flexoelectric effect of BST ceramics. A series of other single unit composites were also fabricated and tested. Effective $d_{33}$ higher than 2000 pC/N at resonance was observed in some composites. FIG. 10A shows actual experimental data, and FIG. 10B shows modeling results with a weight of 0.1 N applied to the center of a ceramic bar to simulate pre-applied force.

Figure 11:
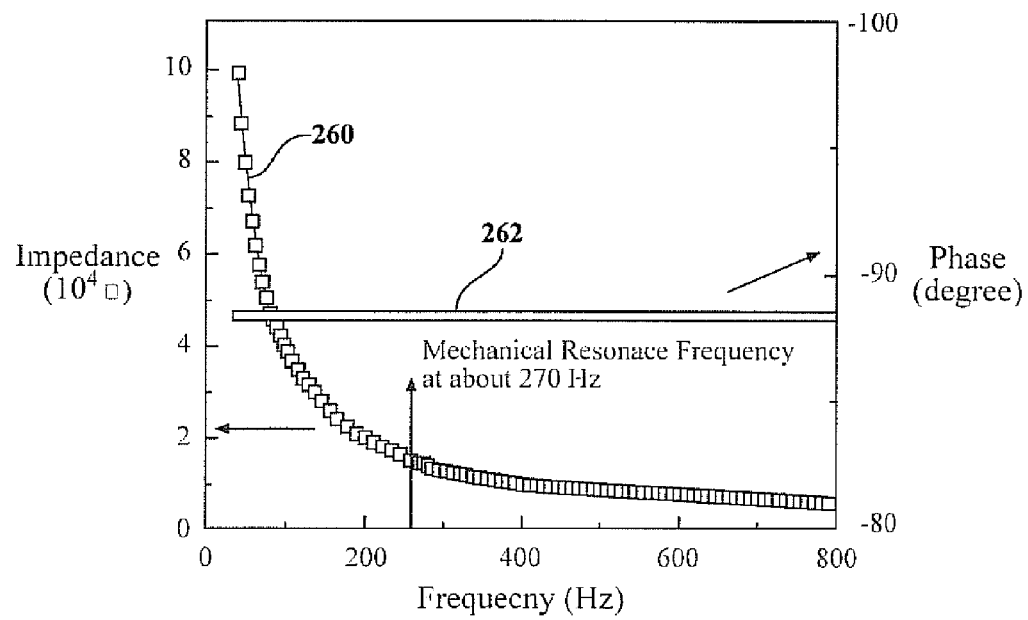
FIG. 11 shows the frequency dependence of impedance of a single layer flexural mode composite

FIG. 11 shows the electrical impedance of the composite as a function of frequency, and also illustrates that no converse effect is observed for this model structure. The electrical impedance measurements of the composite show no evidence of the converse piezoelectric effect. The impedance measurements were performed using a HP 4194 impedance analyzer. Even though strong direct piezoelectric effect has been measured in the composite, especially at the resonance frequency around 270 Hz, no resonance or anti-resonance response is observed. This lack of a converse effect is in great contrast to devices using conventional piezoelectric materials.

The appearance of a converse piezoelectric effect in the flexure composite requires an inhomogeneous electric field, but the applied electric field is almost homogeneous for the BST ceramic sheet in the composite, the sheet acting somewhat like as a parallel plate capacitor. Hence, the converse effect is relatively small, compared with the direct effect.

The separation of direct and converse piezoelectric effect in composites based on flexoelectric effect makes them a class of unusual piezoelectric materials, which is very useful for many applications requiring sensing but not actuating or actuating but not sensing. Lack of converse piezoelectric effect in flexure composite rules out possibility of stress induced piezoelectric effect in the BST ceramics and further confirms that the strong piezoelectric-like response of the composite arises from flexoelectricity of the BST ceramics.

To demonstrate that flexural mode composite can attain high piezoelectric response beyond conventional piezoelectric materials, a six unit three layer composite was constructed and the dimensions of BST ceramic bar in the composite are 32 mm long, 11 mm wide, and 0.2 mm thick. The span between two wires of one single unit of the composite is 16 mm. Electrode pick up was arranged to cover regions of similar sign of strain gradient to avoid charge cancellation. The resonance frequency of the composite is above 300 Hz, as determined by measurement of frequency dependent of the effective $d_{33}$. Above 300 Hz, the effective $d_{33}$ of composite is beyond the measurement capability of $d_{33}$ meter, indicating the appearance of mechanical resonance.

Figure 12:
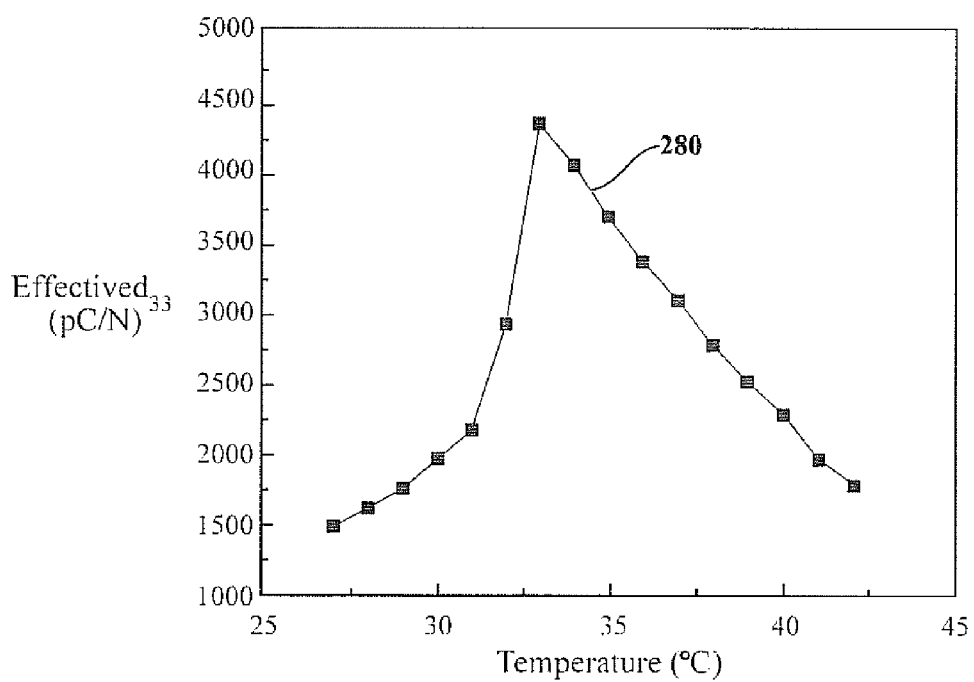
FIG. 12 shows the effective $d_{33}$ of a three-layer six-unit BST device non-resonant at 125 Hz as function of temperature measured on cooling, obtained by multiplying the measured values by a factor based on the ratio of capacitance of the ceramic bars to the reference capacitance in $d_{33}$ meter.

FIG. 12 shows the temperature dependence of the effective $d_{33}$ at 125 Hz, a frequency far away from resonance frequency. Around room temperature, $d_{33}$ of the composite is about 1480 pC/N, a value comparable to that of piezoelectric single crystals. $D_{33}$ of the composite increases with temperature, reaches a maximum value of about 4350 pC/N at about 33° C., a temperature close to the Curie temperature of BST ceramic, and still retains a very high value in the paraelectric phase above the Curie temperature.

Hence, an example apparatus includes an apparatus providing an electrical response to an applied force, the electrical response arising in a material having a Curie temperature, the electrical response being present above the Curie temperature.

The variation of $d_{33}$ with temperature of the composite follows the change of dielectric constant with temperature of BST ceramic and the change can be explained by the relationship between flexoelectric coefficient and dielectric constant. This temperature behavior is additional evidence that the massive piezoelectric response of flexure composite, which can surpass any of conventional piezoelectric materials, originates from the flexoelectricity of BST ceramics.

Figure 13:
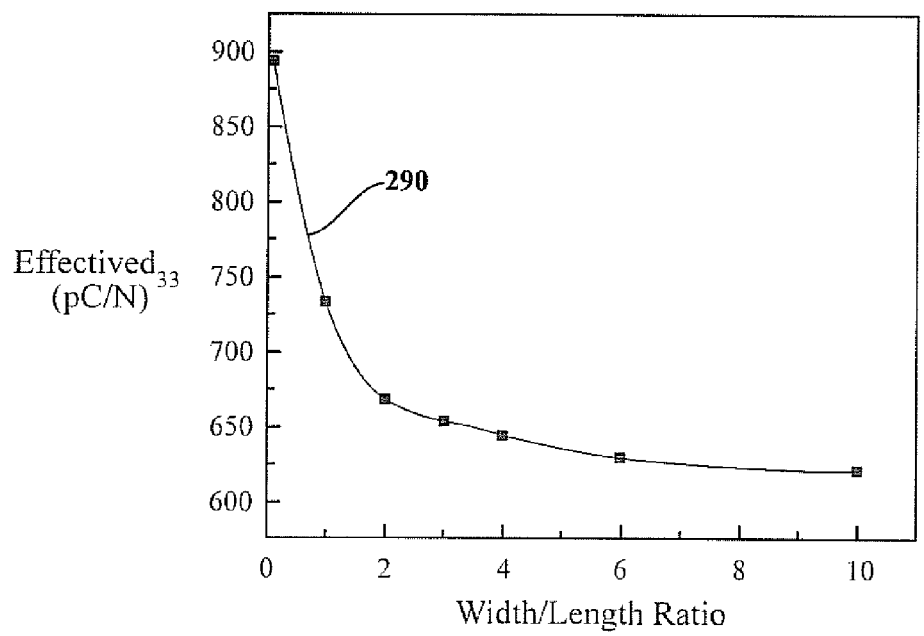
FIG. 13 shows effective $d_{33}$ as a function of length-to-width ratio of planar shaped fauns.

FIG. 13 shows how the effective $d_{33}$ varies as a function of the width to length ratio of shaped forms within the structure, in curve 290.

Based on a simple flexing beam approximation, calculations for a range of simple single cell dimensions are give below in Table 1, where a downgraded effective $\mu_{1111}$ and $\mu_{1122}$ were used to more than compensate for any possible antielastic effect. Table I shows the expected characteristics for the simple bending flexoelectric beam for various beam dimensions illustrating the very high value of effective $d_{33}$ induced in thin beams. The change in of effective $d_{33}$ with number of separations for a ceramic bar of certain dimension and with the same applied force (3 N/m) is given in Table I below:

TABLE I

| Total Length (mm) | Thickness (mm) | Number of cells | Length of unit cell (mm) | Effective $d_{33}$ (pC/N) |
|---|---|---|---|---|
| 16.8 | 0.1 | 1 | 16.8 | $3.7 \times 10^4$ |
| 16.8 | 0.1 | 2 | 8.4, 8.4 | $6.1 \times 10^3$ |
| 16.8 | 0.1 | 3 | 5.6, 5.6, 5.6 | $2.5 \times 10^3$ |
| 16.8 | 0.1 | 4 | 4.6, 5.6, 5.6 | $2.6 \times 10^3$ |

The length dependence of effective $d_{33}$ is given in Table II below:

TABLE II

| Length (mm) | Thickness (mm) | Effective $d_{33}$ (pC/N) |
|---|---|---|
| 16.8 | 0.1 | $3.7 \times 10^4$ |
| 12.6 | 0.1 | $2.1 \times 10^4$ |
| 8.4 | 0.1 | $9.4 \times 10^3$ |

The thickness dependence of the effective $d_{33}$ is given in Table III below:

TABLE III

| Length (mm) | Thickness (mm) | Effective $d_{33}$ (pC/N) |
|---|---|---|
| 16.8 | 0.1 | $3.7 \times 10^4$ |
| 16.8 | 0.05 | $2.1 \times 10^5$ |
| 16.8 | 0.01 | $9.4 \times 10^7$ |

The effective $d_{33}$ increases rapidly as the thickness decreases. These examples are not limiting. In representative examples, the thickness of the flexoelectric sheet may be between 0.001 mm and 1 mm, such as between 0.05 mm and 0.5 mm. Calculations were carried out using flexoelectric coefficient $\mu_{11}=\mu_{12}=30$ μC/m, elastic constant $c_{11}=2.267\times 10^{11}$ Pa, Poisson ratio $\lambda=0.33$, density $\rho=5813$ kg/m$^3$, where the effective $d_{33}$ under non-resonance conditions.

Hence, a flexural mode composite device can generate steep transverse strain gradients allowing a flexoelectric signal to be obtained, in particular with high flexoelectric coefficient materials such as BST ceramics. The flexural mode composite can generate a massive FP response that is much higher than conventional piezoelectric ceramics. In a six unit three layer multilayer composite, an effective $d_{33}$ higher than 4300 pC/N was measured at non-resonance frequency. In a single layer composite, effective $d_{33}$ about 1100 has been observed due to the enhancement of strain gradient at the mechanical resonance frequency. Applications include MEMS and NEMS devices, such as sensors.

Any resonance frequency is determined by various physical parameters of the fabricated structure. These include dimensions of the shaped form, such as thickness, width, and length of a sheet. The resonance frequency is also correlated with the spacing between distorter elements, such as the wires illustrated in FIG. 9A. Hence, the vibrational response of the structure may have a spatial variation due to inbuilt variations in fabrication parameters. For example, the spacing of the distorter elements may vary as a function of position over the structure, so that the resonance frequency correspondingly varies as a function of position. By separating electric signals from different portions of the structure, a spectral analyzer can be fabricated. Vibration of a particular frequency may match the resonance frequency of some portion of the spectral analyzer, inducing a strong signal within that portion.

Conventional piezoelectric materials cannot operate above the Curie temperature, above which the piezoelectric phase vanishes. However, the flexoelectric effect used to obtain electrical signals in examples of the present invention is not limited by the Curie temperature or by any analogous restriction. Hence, the described devices may operate at temperatures well above those conventionally available. The maximum operating temperature may only be restricted by the properties of the material itself, such as the decomposition or melting temperatures.

Hence, examples of the present invention include high temperature applications such as electrical energy recovery from vehicle engines. The mechanical vibration of an engine can be converted into an electrical energy by inducing stress gradients within shaped forms.

A structure according to an example of the present invention may comprise one or more distorter elements. The distorter elements act on the shaped form so as to induce the desired deformation, for example a flexural or bending deformation. The distorter elements may be used to generate a force on an elongated shaped form, such as a sheet, in a direction normal to direction(s) of elongation. The distorter elements may be elongated, such as wires or similar form materials. Conducting materials may be used to collect the flexoelectric signal, as the region of maximum stress may be located proximate the contact point between the distorter element and the shaped form. In representative examples, the spacing between distorter elements may be in the range 10 microns—10 mm, more particularly 100 microns—1 mm.

In other examples, a distorter element may comprise microbeads, elongated prismatic forms, surface protrusions from one or both substrates, and the like. Preferably, the distorter element has an elastic constant sufficiently high so as to effectively induce the deformation of the shaped form.

In some examples, deformation of shaped forms may be thermally induced. For example, a shaped form may include two or more adjacent layers of material, and differential thermal expansion used to induce a bending within the shaped form. This induces a stress gradient across component layers of the shaped form. Electrodes can be located so as to pick up the electrical signal from regions of high stress gradient.

The shaped form may be elongated in one or two directions, for example a rod, sheet, strip, or other form. The direction(s) of elongation may be parallel to the plane of the substrates, before deformation, for example the shaped form being a sheet generally parallel to one or both substrates. A shaped form may have a narrowed portion in which stress gradients tend to be concentrated, with electrodes being located adjacent narrowed regions.

In some examples, a shaped form may bridge the gap between two substrates, so that lateral displacement of one substrate relative to the other induces a bending deformation of the shaped form. For example, the shaped form may comprise a sheet or other elongated form, with the direction of elongation normal to the substrates.

The absence of temperature restrictions means that high band gap materials can be used as flexoelectric materials. In some examples, high band gap semiconductor materials such as silicon, silicon carbide, and the like can be used to form elements.

In some examples of the present invention, cavities may be formed within a material so as to generate stress gradients within the material on application of an external force. The electrodes may be located within the cavities so as to receive the flexoelectric signal.

Examples of the present invention include pressure sensors. For example a sheet-like shaped form may separate two chambers, one chamber being a sealed cavity and the other chamber in fluid communication with a variable pressure. Variations in the pressure induce curvature of the sheet-like element, and this may be detected using suitably placed electrodes.

The electrical configuration of a structure can be adjusted according to requirements. For example, the flexoelectric signals may be connected in series if a high voltage signal is required. For example, high voltages may be required to provide a spark. However, if a higher current is required, individual portions of the structure may be wired in parallel, any appropriate series or parallel combination can be used, according to the electrical properties desired. The output from a device may be rectified and summed to provide a DC output from an alternating flexoelectric signal.

Figure 14:
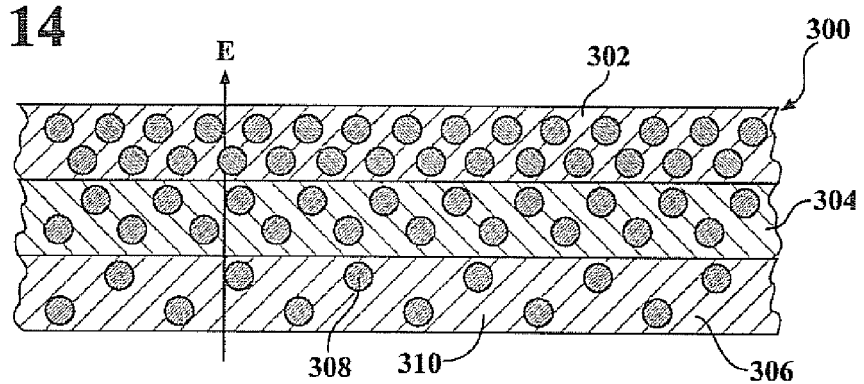
FIG. 14 shows a permittivity gradient within a multilayer, in this case a stepped variation, so that an applied electric field E induces an electric field gradient and hence a flexoelectric actuation of the multilayer.

FIG. 14 shows an alternative configuration of a flexoelectric shaped form 300 comprising a plurality of layers, in this example layers 302, 304, and 306. The layers comprise a high dielectric material particulate 308 dispersed in a low dielectric matrix 310. The density of high dielectric material 308 varies as a function of position through the layer, being higher in layer 302 than in layer 306. Hence application of an electric field b across the multilayer generates an electric field gradient, due to the permittivity gradient, as the electric field is higher within regions of high permittivity. The electric field gradient induces a curvature deformation of the multilayer by the converse flexoelectric effect. Hence, this structure may be used to obtain actuation.

Similar structures to that shown in FIG. 14 can be used to observe a converse flexoelectric effect. If the permittivity of the structures varies as a function of position, along the direction of the applied field, application of the electric field using the electrodes generates an electric field gradient within the structures. This induces a deformation, such as a bending deformation, of the structures.

Hence examples of the present invention include surfaces having nanoscale structures, the conformation of which may be electrically controlled. The surface properties of the material hence can be electrically controlled, and also optical properties may be adjusted. The permittivity may vary continuously across the layer, or a multilayer structure having layers of different permittivity may be used.

Figure 15:
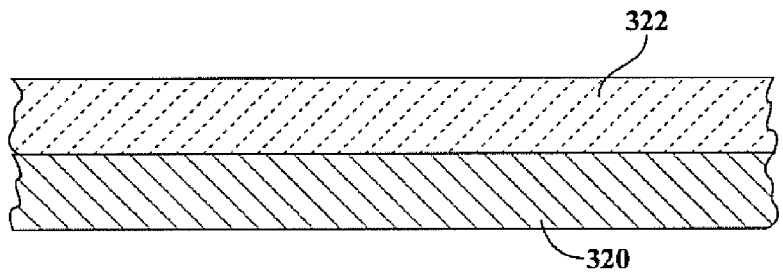
FIG. 15 shows a multilayer including a support layer.

FIG. 15 shows a shaped form comprising at least two layers, one layer being a flexoelectric material such as ceramic layer 322, and the other layer being a flexible support material 320. In this example, support layer 320 may be a flexible material, such as a plastic material, and may support electrodes (not shown), such as metal electrodes. A support layer may be used to enhance the mechanical properties of a deformable structure.

In some examples, the flexoelectric material may be a liquid crystal, such as a nematic liquid crystal, in particular a polymer liquid crystal, such as a nematic polymer liquid crystal. A polymer flexoelectric material may be supported by a flexible support layer as shown in FIG. 15, or may be a freestanding film. Electrodes may be deposited on regions of high stress, so as to collect the flexoelectric In some examples, the shaped form may take the form of a wire extending from the surface. The wire may have nanoscale or microscale dimensions. Electrodes are deposited at positions so as to receive the flexoelectric signal generated by the bending induced stress gradient. Examples of the present invention include energy recovery devices. The energy recovery devices receive a vibrational signal, for example from an engine. Electrical output may be collected and processed in any desired way, for example using rectification, phase reversal, voltage summation, parallel and/or series configurations, and the like. The resonance characteristics of some or all of the energy recovery device may be matched to the vibrational characteristics of the source of mechanical energy.

Figure 16:
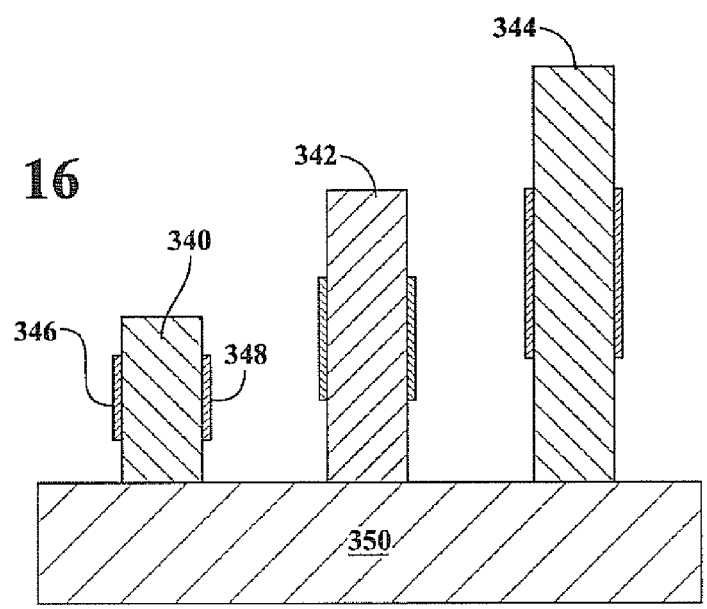
FIG. 16 shows free-standing structures, having a position-dependent resonance vibration so as to allow vibrational analysis using the flexoelectric effect.

FIG. 16 shows freestanding structures 340, 342, and 344 extending from substrate 348. Electrodes, such as electrode 346 and 348, are supported on opposed sides of the freestanding structures. Mechanical deformation of the structures, such as a bending deformation, induces a stress gradient across the structures. This induces a flexoelectric signal which is received by the electrodes. As shown, the length of the structures varies as a function of position. This may be used to adjust resonance characteristics, allowing spectral analysis of vibrational signals to be performed. The free standing structures may be rods, or fin-like structures such as an edge-supported sheet. Resonance frequencies may be adjusted by varying physical parameters such as length, width, thickness, elastic properties, and the like.

Figure 17:
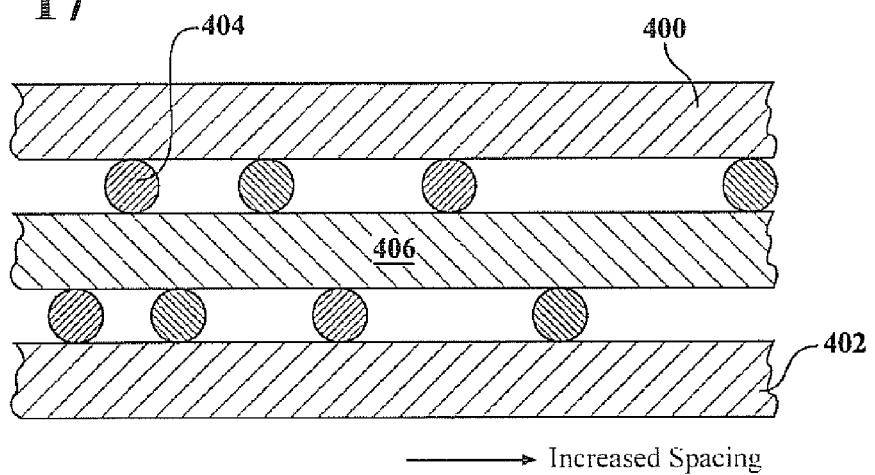
FIG. 17 shows variation in the lateral separation of distorter elements, allowing position-dependent resonance frequency.

FIG. 17 shows two substrates 400 and 402 separated by distorter elements such as 404, and shaped form 406. The lateral separation between the distorter elements increases going from left to right the page, as illustrated. Hence, the resonance frequency of the structure varies from a higher frequency where the spacing is lower, to a lower frequency (on the right) where the spacing is greater. Hence such a device can be used to provide either spectral analysis of an incoming signal, or to smooth out the otherwise spiky resonant response of such a device.

In the configuration of FIG. 17, the shaped form may be a multilayer structure. The layer thickness of a multilayer structure may be adjusted to obtain desired properties.

In some examples, the shaped forms may comprise silicon or similar material, and in some examples may comprise a silicon oxide layer on a silicon substrate. Such materials may readily be fabricated in thin sheets, and are suitable for use as deformable elements.

A shaped form, for example within a flexural device, may be fabricated using tape casting techniques. Shaped forms in the form of sheets having a micron or submicron thickness may be fabricated. However, any thin sheet of dielectric material may be used.

For high temperature applications, a dielectric material having an operational range above those of typical Curie temperatures may be used. Such materials include oxides, in particular zirconate dielectrics. In sonic examples, the dielectric material used may have ferroelectric materials therein. However, the ferroelectric material need not be uniformly oriented or poled as in a conventional ferroelectric device. A layer may comprise a plurality of microcrystals or nanocrystals of high dielectric constant. In many cases, flexoelectric coefficients scale with dielectric constant, so that a high flexoelectric response can be obtained using a high dielectric constant material.

In some examples, distorter elements or other spacing elements may be located between sheets. Elastic and viscoelastic properties may be adjusted to obtain the desired resonance sharpness, or conversely to smear out a resonance to provide a wider operational frequency range.

In some examples a sheet may be a multilayer material, so that application of an electric field generates curvature. For example, nanoparticles may be dispersed through a matrix layer, and the nanoparticle density having a gradient so as to generate a permittivity gradient in a desired direction. On application of an electric field, the shaped form bends, allowing actuation under electric field control.

Applications

Applications include: improved materials for sonar and medical ultrasound systems; fine scale composites that are particularly appropriate for high frequency ultrasound; smart systems able to make use of independent control of direct and converse effects, such as active systems for acoustic stealth; high activity MEMs systems; miniaturized control for unmanned vehicles; composites with an apparent piezoelectric constant orders of magnitudes greater than conventional materials arising from new artificial symmetries; chemistry on a chip applications; an improved fingerprint scanner; sonar applications; miscreant control devices; and improved piezoelectric transducers and loudspeakers.

Pixel driven phased arrays in high frequency ultrasound need high power from small pixel elements. To get high power in at low voltage for simple CMOS control requires high dielectric permittivity. For PZT $\in_r$ max ~3,000, whereas in $(Ba,Sr)TiO_3$, $\in_r$ max ~20,000, a significant advantage for applications where high permittivity is desired.

Flexoelectric composites offer lead-free alternatives to conventional PZT-based piezoceramics. In particular, flexoelectric $\mu_{ijkl}$ constants in lead-free soft mode high permittivity perovskite ceramics can be 6 to 7 order of magnitude larger than in other low permittivity solids, allowing excellent flexoelectric performance, particularly in composites with reduced scale texture symmetry (e.g. layer thicknesses less than 1 mm). Bending modes in thin sheets yielded a multilayer structure with an effective $d_{33}$>4000 pc/N and multiple low frequency resonances in the 100 Hz region.

Applications include energy recovery from vibrating structures, such as engines. The flexoelectric response is due to the device configuration, such as in-built texture symmetry, and so there is no Curie temperature limit as in conventional piezoelectric materials. Hence, applications include high-temperature operations, in some cases only limited be the decomposition or melting temperatures of components.

Unlike conventional piezoelectric materials, poling is not required, and is not possible for centrosymmetric materials. Hence, example FP composites cannot be depoled thermally, electrically, or mechanically. This is an advantage over conventional devices. Examples include ceramic flexoelectric sensor devices, which may include tapered forms, bendable sheets, or other bendable structures such as rods and other elongated elements.

Patents, patent applications, or publications mentioned in this specification are incorporated herein by reference to the same extent as if each individual document was specifically and individually indicated to be incorporated by reference. In particular, U.S. patent application Ser. Nos. 11/770,318 and 12/179,807, both to Cross et al., are incorporated herein by reference.

The invention is not restricted to the illustrative examples described above. Examples are not intended as limitations on the scope of the invention. Methods, apparatus, compositions, and the like described herein are exemplary and not intended as limitations on the scope of the invention. Changes therein and other uses will occur to those skilled in the art. The scope of the invention is defined by the scope of the claims.

Having described our invention, we claim:

1. An apparatus providing an electrical signal in response to an applied force, the apparatus comprising:
   a first substrate;
   a second substrate;
   a shaped form located between the first substrate and the second substrate;
   a distorter element that is urged against the shaped form on application of the force between the first and second substrates,
   the distorter element inducing the flexural deformation of the shaped form,
   the applied force being applied between the first and second substrates, the shaped form being configured so that the applied force induces a stress gradient the shaped form,
   the stress gradient arising from a flexural deformation of shaped form; and
   first and second electrodes providing an electrical signal in response to the applied force, the electrical signal originating from a flexoelectric effect in the shaped form.

2. The apparatus of claim 1, the apparatus providing no appreciable mechanical response in response to an electric field applied between the first and second electrodes.

3. The apparatus of claim 1, the shaped form being a sheet that undergoes a flexural deformation on application of the force between the first and second substrates.

4. The apparatus of claim 3, the sheet being a ceramic sheet.

5. The apparatus of claim 4, the ceramic sheet having a sheet thickness, the sheet thickness being less than 1 mm.

6. The apparatus of claim 1, the distorter element being a wire.

7. The apparatus of claim 6, the apparatus including a plurality of distorter elements.

8. The apparatus of claim 7, wherein the shaped form is a ceramic sheet, the plurality of distorter elements inducing a corrugation of the ceramic sheet on application of the force.

* * * * *

UNITED STATES PATENT AND TRADEMARK OFFICE
CERTIFICATE OF CORRECTION

PATENT NO.      : 8,288,922 B2                                              Page 1 of 1
APPLICATION NO. : 12/875474
DATED           : October 16, 2012
INVENTOR(S)     : L. Eric Cross et al.

It is certified that error appears in the above-identified patent and that said Letters Patent is hereby corrected as shown below:

In the Specification
Col. 2, line 55: replace "An conventional" with --a conventional--;
Col. 4, line 37: replace "fauns" with --forms--;
Col. 5, line 45: replace "air-filed" with --air-filled--;
Col. 9, line 14: replace "platen" with --plated--;
Col. 11, line 18: replace "or the second" with --for the second--;
Col. 16, line 22: replace "d33" with --$d_{33}$--;
Col. 16, line 31: replace "d33" with --$d_{33}$--;
Col. 21, line 20: replace "flexoelectric" with --flexoelectric signal.--;
Col. 21, line 51: replace "right the" with --right of the--;
Col. 22, line 7: replace "sonic examples" with --some examples--;
Col. 22, line 62: replace "be the" with --by the--;

In the Claims
Col. 24, line 5: replace "gradient the" with --gradient on the--.

Signed and Sealed this
Fifth Day of November, 2013

Teresa Stanek Rea
*Deputy Director of the United States Patent and Trademark Office*